United States Patent
Injarapu et al.

(10) Patent No.: US 12,181,958 B2
(45) Date of Patent: Dec. 31, 2024

(54) SCALABLE ARCHITECTURE FOR ERROR CAPTURING WITH SINGLE LOGGER APPROACH FOR AUTOMOTIVE SYSTEMS

(71) Applicant: QUALCOMM Incorporated, San Diego, CA (US)

(72) Inventors: Sateeshkumar Injarapu, Bangalore (IN); Manish Kumar Saxena, Bangalore (IN); Amit Duggal, Bangalore (IN); Nitin Jaiswal, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 97 days.

(21) Appl. No.: 18/145,925

(22) Filed: Dec. 23, 2022

(65) Prior Publication Data

US 2024/0211336 A1    Jun. 27, 2024

(51) Int. Cl.
*G06F 11/00* (2006.01)
*G06F 11/07* (2006.01)

(52) U.S. Cl.
CPC ...... *G06F 11/0787* (2013.01); *G06F 11/0781* (2013.01); *G06F 11/0784* (2013.01)

(58) Field of Classification Search
CPC ............. G06F 11/0787; G06F 11/0781; G06F 11/0784; G06F 11/0721; G06F 11/0724; G06F 11/0766; G06F 11/3024; G06F 11/073; G06F 11/3037
See application file for complete search history.

(56) References Cited

U.S. PATENT DOCUMENTS

| | | | | |
|---|---|---|---|---|
| 4,964,129 A | * | 10/1990 | Bowden, III | G06F 11/106 714/719 |
| 7,225,368 B2 | * | 5/2007 | Lancaster | G06F 11/0781 714/48 |
| 2004/0225948 A1 | * | 11/2004 | Adkisson | G06F 11/0724 714/776 |
| 2010/0192029 A1 | * | 7/2010 | Wang | G06F 11/2284 714/E11.147 |
| 2018/0032394 A1 | * | 2/2018 | Quach | G06F 11/1068 |

(Continued)

OTHER PUBLICATIONS

International Search Report and Written Opinion—PCT/US2023/036368—ISA/EPO—Feb. 8, 2024. 14 pages.

*Primary Examiner* — Joseph D Manoskey
(74) *Attorney, Agent, or Firm* — Muncy, Geissler, Olds & Lowe, P.C./QUALCOMM

(57) ABSTRACT

Various embodiments include methods and devices for error capturing implemented in a computing device. Embodiments may include receiving a plurality of error data for a plurality of memories of a plurality of processors at an error logger, including an error data for a memory of a processor having an identification of at least one faulty bit of the memory. Embodiments may include receiving a plurality of requests from a plurality of error capture modules for the processor at an error selection module for the processor, and retrieving an error data from an error capture module by the error selection module in response to a request from the error capture module being ordered prior to another request from another error capture module. Embodiments may include sending the error data to the error logger, and storing the error data at the error logger in an order relative to another error data.

30 Claims, 11 Drawing Sheets

(56) References Cited

U.S. PATENT DOCUMENTS

| | | |
|---|---|---|
| 2019/0050279 A1 | 2/2019 | Derr et al. |
| 2020/0167221 A1 | 5/2020 | Vembu et al. |
| 2021/0055982 A1* | 2/2021 | Esposito ............... G06F 11/073 |
| 2022/0122682 A1* | 4/2022 | Sharma ............... G06F 11/1048 |
| 2022/0318087 A1* | 10/2022 | Hong .................. G06F 11/0793 |

* cited by examiner

SCALABLE ARCHITECTURE FOR ERROR CAPTURING WITH SINGLE LOGGER APPROACH FOR AUTOMOTIVE SYSTEMS

BACKGROUND

Computing systems protect against memory faults using error correction code (ECC) to correct a single bit fault or detect and report a double bit fault. A memory fault will be reported as an interrupt to safety monitoring circuitry (referred to herein as a "safety monitor) and trigger a corrective action. The safety monitor requires information about the memory fault, such as type of fault (single bit or double bit), a faulty memory address, and a faulty memory ID. ECC loggers are used to store this error information.

SUMMARY

Various disclosed aspects include apparatuses and methods of error capturing implemented in a computing device, including receiving a plurality of error data for a plurality of memories of a plurality of processors at an error logger, in which the plurality of memories of the plurality of processors includes a first memory of a first processor and the plurality of error data includes a first error data for the first memory of the first processor including an identification of at least one faulty bit of the first memory. Some aspects may further include receiving the plurality of error data for the plurality of memories of the plurality of processors at a plurality of error capture modules including receiving the first error data at an error capture module of the plurality of error capture modules.

Some aspects may further include receiving a plurality of requests from a plurality of error capture modules for the first processor at an error selection module for the first processor, wherein each of the plurality of requests is configured to indicate to the error selection module at least one error data of the plurality of error data is stored at an error capture module of the plurality of error capture modules, and retrieving the first error data from a first error capture module of the plurality of error capture modules by the error selection module in response to a first request of the plurality of requests from the first error capture module having priority to a second request of the plurality of requests from a second error capture module of the plurality of error capture modules. Some aspects may further include sending the first error data to the error logger, and storing the first error data at the error logger in an order relative to a stored error data of a memory of the plurality of memories of the plurality of processors, wherein the plurality of error data includes the stored error data. Some aspects may further include sending, from the error logger to the error selection module, a first acknowledgement signal configured to indicate receipt of the first error data, and retrieving a second error data from the second error capture module by the error selection module in response to the second request and the first acknowledgement signal. In some aspects, the second request may have priority to a third request of the plurality of requests from a third error capture module of the plurality of error capture modules, and the method may further include sending, from the error logger to the error selection module, a second acknowledgement signal configured to indicate receipt of the second error data, and retrieving a third error data from the third error capture module by the error selection module in response to a third request and the second acknowledgement signal.

Some aspects may further include receiving the first error data for the first memory of the first processor at the error logger, wherein the first error data includes an identification of a number of faulty bits, generating a first interrupt signal configured as a single bit fault indicator in response to the identification of the number of faulty bits being one bit, and generating a second interrupt signal configured as a double bit fault indicator in response to the identification of the number of faulty bits being two bits. Some aspects may further include receiving a third interrupt signal at a functional safety unit from the error logger, generating a first safety signal by the functional safety unit in response to the third interrupt signal being the first interrupt signal, and generating a second safety signal by the functional safety unit in response to the third interrupt signal being the second interrupt signal.

In some aspects, the plurality of error data may be configured with information identifying at least one faulty bit-cell location of the memory that is faulty. In some aspects, the error logger may be a single error logger for the plurality of memories of the plurality of processors.

Further aspects include a computing device having a processor configured to perform operations of any of the methods summarized above. Further aspects include a computing device having means for performing functions of any of the methods summarized above. Further aspects include a non-transitory processor-readable medium having stored thereon processor-executable instructions configured to cause a processor and other components of a computing device to perform operations of any of the methods summarized above.

BRIEF DESCRIPTION OF THE DRAWINGS

The accompanying drawings, which are incorporated herein and constitute part of this specification, illustrate example embodiments of various embodiments, and together with the general description given above and the detailed description given below, serve to explain the features of the claims.

DETAILED DESCRIPTION

Figure 1:
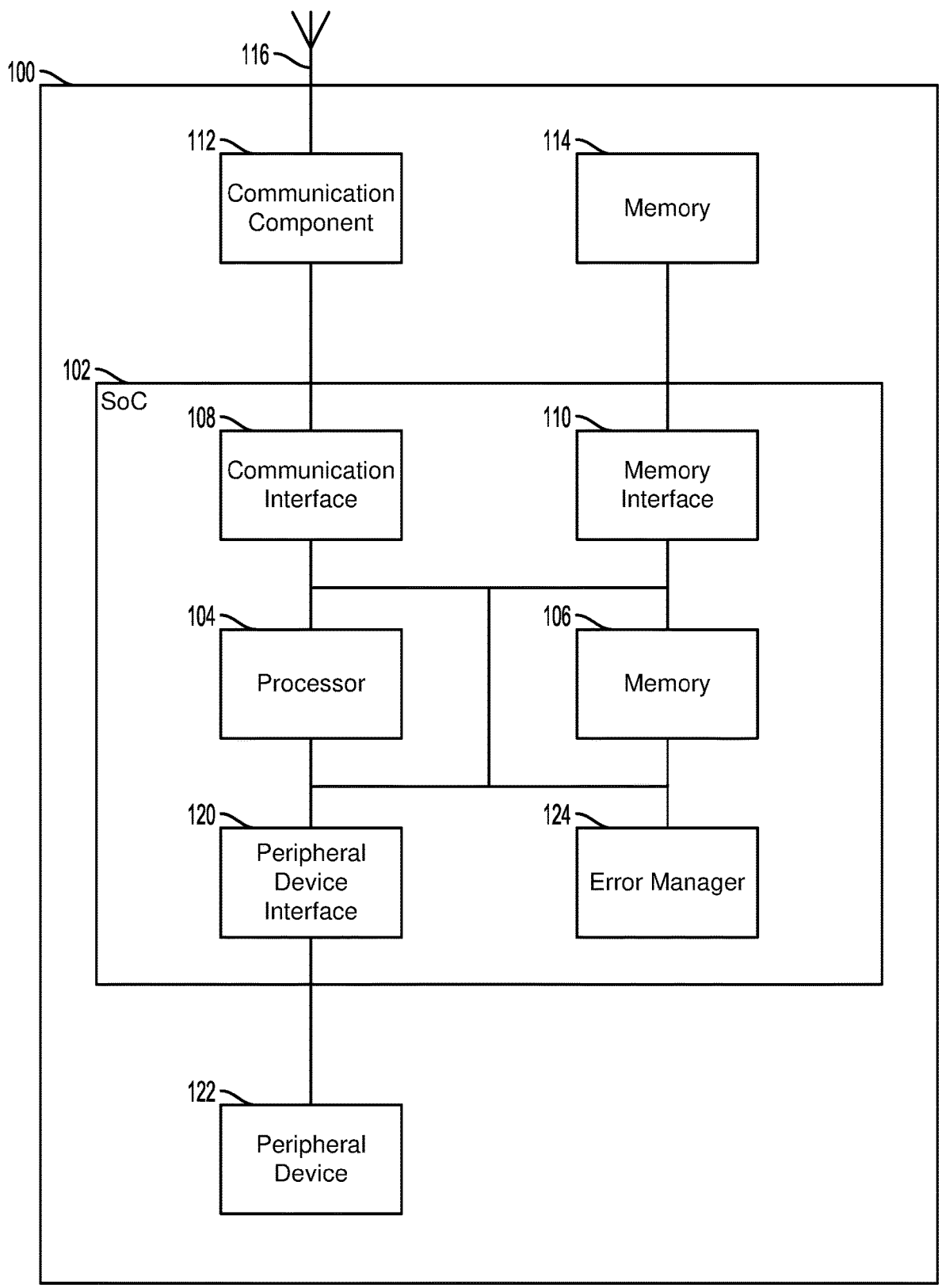
FIG. 1 is a component block diagram illustrating an example computing device suitable for implementing various embodiments.

Various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the claims.

Various embodiments include methods, and computing devices implementing such methods of error capture with a scalable architecture for error capturing with a single error logger. The error logger may be configured to receive error data from multiple memories of multiple processors of a computing device. Each of the multiple processors may have multiple error capture modules associated with or coupled to multiple memories and an error selection module configured to select error data from the error capture modules to send to the error logger based on a priority of the error data relative to the other error data. The error data may include information indicating to the error logger a number of faulty bits of the memory associated with the error data, and the error logger may generate an interrupt signal specific to or indicating the number of faulty bits.

The term "computing device" may refer to stationary computing devices including personal computers, desktop computers, all-in-one computers, workstations, super computers, mainframe computers, embedded computers (such as in vehicles and other larger systems), computerized vehicles (e.g., partially or fully autonomous terrestrial, aerial, and/or aquatic vehicles, such as passenger vehicles, commercial vehicles, recreational vehicles, etc.), servers, multimedia computers, and game consoles. The terms "computing device" and "mobile computing device" are used interchangeably herein to refer to any one or all of cellular telephones, smartphones, personal or mobile multi-media players, personal data assistants (PDA's), laptop computers, tablet computers, convertible laptops/tablets (2-in-1 computers), smartbooks, ultrabooks, netbooks, palm-top computers, wireless electronic mail receivers, multimedia Internet enabled cellular telephones, mobile gaming consoles, wireless gaming controllers, and similar personal electronic devices that include a memory, and a programmable processor.

Various embodiments are described in terms of code, e.g., processor-executable instructions, for ease and clarity of explanation, but may be similarly applicable to any data, e.g., code, program data, or other information stored in memory. The terms "code," "data," and "information" are used interchangeably herein to refer to similar elements and are not intended to limit the scope of the claims and descriptions to the types of code, data, or information used as examples in describing various embodiments.

Computing systems protect against memory faults using error correction code (ECC) to correct a single bit fault or detect and report a double bit fault. A memory fault will be reported as an interrupt to safety monitor. The interrupt may also trigger a corrective action. The safety monitor requires information about the memory fault, such as type of fault (single bit or double bit), a faulty memory address, and a faulty memory ID. ECC loggers are used to store this error information.

Conventionally, computing systems with multiple processors or subsystems will employ at least one ECC logger per processor or subsystem to store error information. In known systems, each ECC logger is associated with a limited number of memories per processor or subsystem (e.g., one ECC logger per 4, 8, or 16 memories of a processor or subsystem). The cost of ECC loggers in-terms of area, pin count, routability, scalability, maximum frequency for subsystems increases as a number of memories increases and placement of memories spans multiple design hierarchies, degrading power, performance, and area metrics. Additionally safety software need to read error information from multiple ECC loggers to identify the error correctly generates significant software overhead.

Various embodiments described herein address and overcome the foregoing issues of multiple ECC loggers by reducing the number of ECC loggers, or error loggers, implemented in a computing system to as few as a single error logger. Various embodiments include a scalable architecture for error capturing with a single error logger implemented for multiple processors of a subsystem and/or multiple subsystems. As few as one error logger may be implemented to store error information for multiple memories across multiple processors of a subsystem and/or multiple subsystems. The scalable architecture for error capturing with a single error logger may be scalable for any computing system design without any dependency on memory count and/or hierarchy of the memory. As few as a single error logger may be implemented without limitation to a number of memories. The scalable architecture may include an error selection module configured to control the transmission of error information from multiple memories to an error logger in a sequential manner.

Implementing as few as one error logger for multiple processors of a subsystem and/or multiple subsystems reduces the number of error loggers in a computing system, reducing the area required for implementing the error loggers. The error selection module controlling the transmission of error information from multiple memories to an error logger reduces the pin count required for implementing the error loggers by decoupling the number of pins required from the number of memories associated with the error logger, rather than using a designated number of pins for all of the memories associated with the error logger. Implementing as few as one error logger for multiple processors of a subsystem and/or multiple subsystems reduces software overhead by reducing the number of reads for error information required for ECC error loggers to identify the error correctly.

In some embodiments, design of the computing system may include an error logger using a slower clock than the multiple processors of the subsystem and/or the multiple subsystems associated with the error logger. The separation of time domains for the error logger and the multiple processors of the subsystem and/or the multiple subsystems associated with the error logger reduces, as much as eliminating, the impact of error logger on the maximum frequency of the multiple processors of the subsystem and/or the multiple subsystems. Reducing the number of error loggers reduces the software overhead of reading the error information by reducing the number of locations needed to be read by the software.

FIG. 1 illustrates a system including a computing device 100 suitable for use with various embodiments. The computing device 100 may include an SoC 102 with a processor 104, a memory 106, a communication interface 108, a memory interface 110, a peripheral device interface 120, and an error manager 124. The computing device 100 may further include a communication component 112, such as a wired or wireless modem, a memory 114, an antenna 116 for establishing a wireless communication link, and/or a peripheral device 122. The processor 104 may include any of a variety of processing devices, for example a number of processor cores.

The term "system-on-chip" or "SoC" is used herein to refer to a set of interconnected electronic circuits typically, but not exclusively, including a processing device, a memory, and a communication interface. A processing device may include a variety of different types of processors 104 and/or processor cores, such as a general purpose processor, a central processing unit (CPU), a digital signal processor (DSP), a graphics processing unit (GPU), an accelerated processing unit (APU), a secure processing unit (SPU), a neural processing unit (NPU), an intellectual property unit (IPU), a subsystem processor of specific components of the computing device, such as an image processor for an imaging subsystem, a display processor for a display subsystem, a modem processor for a communication system, a vehicle control processor for a vehicle navigation system, an auxiliary processor, a peripheral device processor, a single-core processor, a multicore processor, a controller, and/or a microcontroller. A processing device may further embody other hardware and hardware combinations, such as a field programmable gate array (FPGA), an application-specific integrated circuit (ASIC), other programmable logic device, discrete gate logic, transistor logic, performance monitoring hardware, watchdog hardware, and/or time references. Integrated circuits may be configured such that the components of the integrated circuit reside on a single piece of semiconductor material, such as silicon.

An SoC 102 may include one or more processors 104. The computing device 100 may include more than one SoC 102, thereby increasing the number of processors 104. The computing device 100 may also include processors 104 that are not associated with an SoC 102. Individual processors 104 may be multicore processors. Each processor 104 may be configured for specific purposes that may be the same as or different from other processors 104 of the computing device 100. One or more of the processors 104 of the same or different configurations may be grouped together. A group of processors 104 may be referred to as a multi-processor cluster.

The memory 106 of the SoC 102 may be a volatile or non-volatile memory configured for storing data and processor-executable code for access by one or more of the processor 104 or other components of SoC 102. The computing device 100 and/or SoC 102 may include one or more memories 106 configured for various purposes. One or more memories 106 may include volatile memories such as random-access memory (RAM) or main memory, or cache memory. These memories 106 may be configured to temporarily hold a limited amount of data received from a data sensor or subsystem, data and/or processor-executable code instructions that are requested from volatile and/or non-volatile memory, loaded to the memories 106 from volatile and/or non-volatile memory in anticipation of future access based on a variety of factors, and/or intermediary processing data and/or processor-executable code instructions produced by the processor 104 and temporarily stored for future quick access without being stored in non-volatile memory. The memory 106 may be configured to store data and processor-executable code, at least temporarily, that is loaded to the memory 106 from another memory device, such as another memory 106 or memory 114, for access by one or more of the processor 104 or other components of SoC 102. In some embodiments, any number and combination of memories 106 may include one-time programmable or read-only memory.

The memory interface 110 and the memory 114 may work in unison to allow the computing device 100 to store data and processor-executable code on a volatile and/or non-volatile storage medium, and retrieve data and processor-executable code from the volatile and/or non-volatile storage medium. The memory 114 may be configured much like an embodiment of the memory 106 in which the memory 114 may store the data or processor-executable code for access by one or more of the processor 104 or other components of SoC 102. In some embodiments, the memory 114, being non-volatile, may retain the information after the power of the computing device 100 has been shut off. When the power is turned back on and the computing device 100 reboots, the information stored on the memory 114 may be available to the computing device 100. In some embodiments, the memory 114, being volatile, may not retain the information after the power of the computing device 100 has been shut off. The memory interface 110 may control access to the memory 114 and allow one or more of the processor 104 or other components of the SoC 12 to read data from and write data to the memory 114.

The error manager 124 may be a component of the computing device 100 configured to store error data received from components of multiple processors 104 of the SoC 102 and/or subsystems. The error manager 124 may analyze the error data to determine how many bits of a memory 106 are faulty, such as a single bit or multiple bits, including two bits, and generate signals associated with the number of faulty bits. The error manager may transmit the generated signals to systems (not shown) of the computing device 100 configured to respond to indications of faulty memory based on the signals, such as a safety monitor configured to maintain safe operation of the computing device in the event of a faulty memory. Embodiments of the error manager 124 are described further herein.

Some or all of the components of the computing device 100 and/or the SoC 102 may be arranged differently and/or combined while still serving the functions of the various embodiments. The computing device 100 may not be limited to one of each of the components, and multiple instances of each component may be included in various configurations of the computing device 100.

Figure 2:
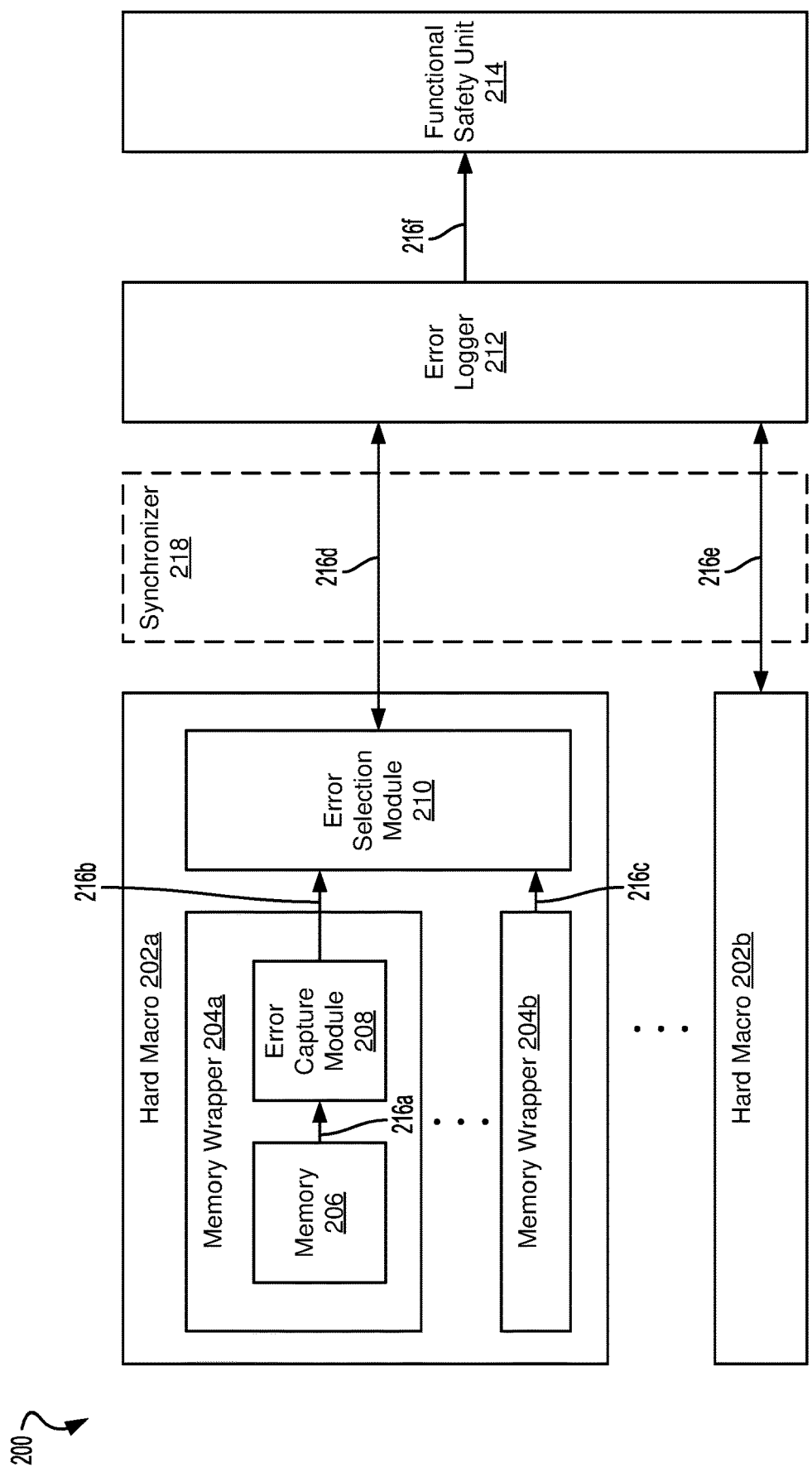
FIG. 2 is a component block diagram illustrating a scalable architecture for error capturing with a single error logger suitable for implementing various embodiments.

FIG. 2 illustrates a scalable architecture for error capturing with a single error logger suitable for implementing various embodiments. With reference to FIGS. 1 and 2, the scalable architecture 200 may include multiple hard macros 202a, 202b (e.g., processor 104 in FIG. 1, subsystem discussed herein with reference to FIG. 1) connected to an error logger 212 (e.g., error manager 124 in FIG. 1). In some embodiments, the scalable architecture 200 may include a synchronizer 218 connected between the multiple hard macros 202a, 202b and the error logger 212. In some embodiments, the scalable architecture 200 may include a functional safety unit 214 (e.g., error manager 124 in FIG. 1)

connected to the error logger 212. Various components of the scalable architecture 200 may be electrically connected via any number and combination of electrical conduits 216a, 216b, 216c, 216d, 216e, 216f, such as communication lines and/or buses.

The hard macros 202a, 202b may include multiple memory wrappers 204a, 204b, such as two or more. Any of the hard macro 202a, 202b may include a same and/or different number of memory wrappers 204a, 204b. Each memory wrapper 204a, 204b may include a memory 206 (e.g., memory 106 in FIG. 1) connected to an error capture module 208. Each error capture module 208 may be connected to an error selection module 210.

The memory may suffer from one or more faulty bits resulting in an error that may be identified by an error correction code (ECC) implemented by the memory 206, such as in a memory controller (not shown). The memory 206 may generate a memory fault interrupt and a memory fault signature, which may be referred to herein, independently and/or cumulatively in whole and/or in part, as error data. The memory fault signature may include information regarding the memory fault, such as a hard macro identifier (ID), a memory ID, a memory address, and an ECC status. The hard macro ID may be configured to identify the hard macro 202a, 202b to which the memory 206 experiencing the fault belongs. The memory ID may be configured to identify the memory 206, of the hard macro 202a, 202b, that is experiencing the fault. The memory ID may also be configured to identify one or more bit-cell locations, of the memory 206, that are experiencing the fault. The memory address may be configured to identify a location at which the memory 206 is experiencing the fault. The ECC status may be configured to indicate a number of bits at the location at which the memory 206 is experiencing the fault. The number of bits may be any number, such as one bit or more, including two bits. The ECC status may indicate a single bit fault for one faulty bit at the location of the memory 206 experiencing the fault. The ECC status may indicate a double bit fault for two faulty bits at the location of the memory 206 experiencing the fault. The error data may identify the one or more bits of the memory 206 that are faulty. For example, the one or more bit-cell locations in the memory address in the memory 206 for the hard macro 202a, 202b may be used to identify one or more bits of the memory that are faulty.

The memory 206 may send the error data to the error capture module 208. The error capture module 208 may receive the error data from the memory 206, store the error data, and generate and send a request to transmit the error data to the error selection module 210. For example, the error capture module 208 may include memory (e.g., memory 106 in FIG. 1) (not shown), such as registers, of suitable size to store at least one instance of the memory fault signature.

The error selection module 210 may receive requests from multiple error capture modules 208, prioritize the requests, retrieve the error data from the capture modules 208 in response to receiving the requests, and send the error data to the error logger 212. For example, the error selection module 210 may prioritize the requests based on the error capture modules 208 from which the requests are received. In some embodiments, the error capture modules 208 may be associated with a priority. In some embodiments, the priority of the error capture modules 208 may be altered based on when requests are received from the error capture modules 208 relative to when requests are received from other error capture modules 208. In some embodiments, altering the priority may involve managing priority of the error capture modules 208 in a round robin manner in which priority is shifted among a group of error capture modules 208 based on which error capture modules 208 may a request and when. In some embodiments, the error selection module 210 may prioritize the requests based on an order in which or a time at which the requests are received. The error selection module 210 may retrieve the error data from the capture modules 208 in response to receiving the requests based on priority of the requests. The error selection module 210 may send the error data retrieved from one error capture module 208 to the error logger 212 prior to retrieving further error data from an error capture module 208.

A simplified round robin example may include four error capture modules 208, each assigned a different priority 1-4, with one being the highest priority and 4 being the lowest priority. For example, an error capture module 1 may have a priority 1, an error capture module 2 may have a priority 2, an error capture module 3 may have a priority 3, and an error capture module 4 may have a priority 4. In this example, a request may be first received from the error capture module 2 with priority 2 and the error selection module 210 may retrieve the error data from the error capture module 2 and send the error data to the error logger 212. As a result, the priorities of the error capture modules 1-4 may be shifted so that the error capture module 1 with priority 1 becomes priority 3, the error capture module 2 with priority 2 becomes priority 4, the error capture module 3 with priority 3 becomes priority 1, and the error capture module 4 with priority 4 becomes priority 2. Extending this example, a request may be received from the error capture module 1 with priority 3 and from the error capture module 3 with priority 1. The error selection module 210 may first retrieve the error data from the error capture module 3 and send the error data to the error logger 212, and then retrieve the error data from the error capture module 1 and send the error data to the error logger 212. The priorities of the error capture modules 1-4 may be shifted so that the error capture module 1 with priority 3 becomes priority 4, the error capture module 2 with priority 4 becomes priority 1, the error capture module 3 with priority 1 becomes priority 2, and the error capture module 4 with priority 2 becomes priority 3.

The error logger 212 may store error data received from the error selection modules 210 of multiple hard macros 202a, 202b. The error logger 212 may analyze the stored error data to determine how many faulty bits are associated with the error data. For example, the error logger 212 may analyze the ECC status of the error data to determine how many faulty bits are associated with the error data. For an ECC status of a single bit error, the error logger 212 may determine one faulty bit is associated with the error data. For an ECC status of a double bit error, the error logger 212 may determine two faulty bits are associated with the error data. Based on the number of faulty bits associated with the error data, the error logger 212 may generate different interrupt signals in which interrupt signal is configured to indicate the number of faulty bits associated with the error data. For example, the error logger 212 may generate an interrupt signal configured as a single bit fault indicator and an interrupt signal configured as a double bit fault indicator. The interrupt signals may be sent by the error logger 212 to the functional safety unit 214. The error data may also be sent by the error logger 212 to the functional safety unit 214.

The functional safety unit 214 may receive the interrupts and the error data from the error logger 212 and store the error data. The functional safety unit 214 may analyze the interrupts and generate further signals for a safety monitor as described further herein. The functional safety unit 214 may also make the error data available to the safety monitor.

In some embodiments, the multiple hard macros 202a, 202b may operate at different frequencies, different clock speeds, than the error logger 212. For example, the multiple hard macros 202a, 202b may operate at higher frequencies, faster clock speeds, than the error logger 212. Communication between the hard macros 202a, 202b and the error logger 212 operating at different frequencies may be synchronized by a synchronizer 218, configured to maintain the data transmitted between the hard macros 202a, 202b and the error logger 212 in a stable state for the hard macros 202a, 202b and/or the error logger 212 to receive the data based on respective frequencies of operation. For example, the synchronizer 218 may maintain the error data sent from the hard macros 202a, 202b in a stable state for the error logger 212 to receive. For example, the synchronizer 218 may maintain an acknowledgement signal sent from the error logger 212 in a stable state for the hard macros 202a, 202b to receive. In some embodiments, the synchronizer 218 may be a standalone component of the scalable architecture 200. In some embodiments, the synchronizer 218 may include components that are integral to other components of the scalable architecture 200 the hard macros 202a, 202b and/or the error logger 212. In some embodiments, the synchronizer 218 and/or components of the synchronizer 218 may be implemented for individual hard macros 202a, 202b.

The example illustrated in FIG. 2 shows two hard macros 202a, 202b connected to the error logger 212 for ease of explanation and clarity, and does not limit the number of hard macros that may be connected to the error logger 212 in the claims and the specification. The example illustrated in FIG. 2 shows two memory wrappers 204a, 204b per hard macro 202a for ease of explanation and clarity, however, any number of hard macros greater than two may be connected to the error logger 212. Further, any number of memory wrappers greater than two may be included as part of a hard macro. The example illustrated in FIG. 2 is not intended to limit the number of memory wrappers per hard macro in the claims and the specification.

Figure 3:
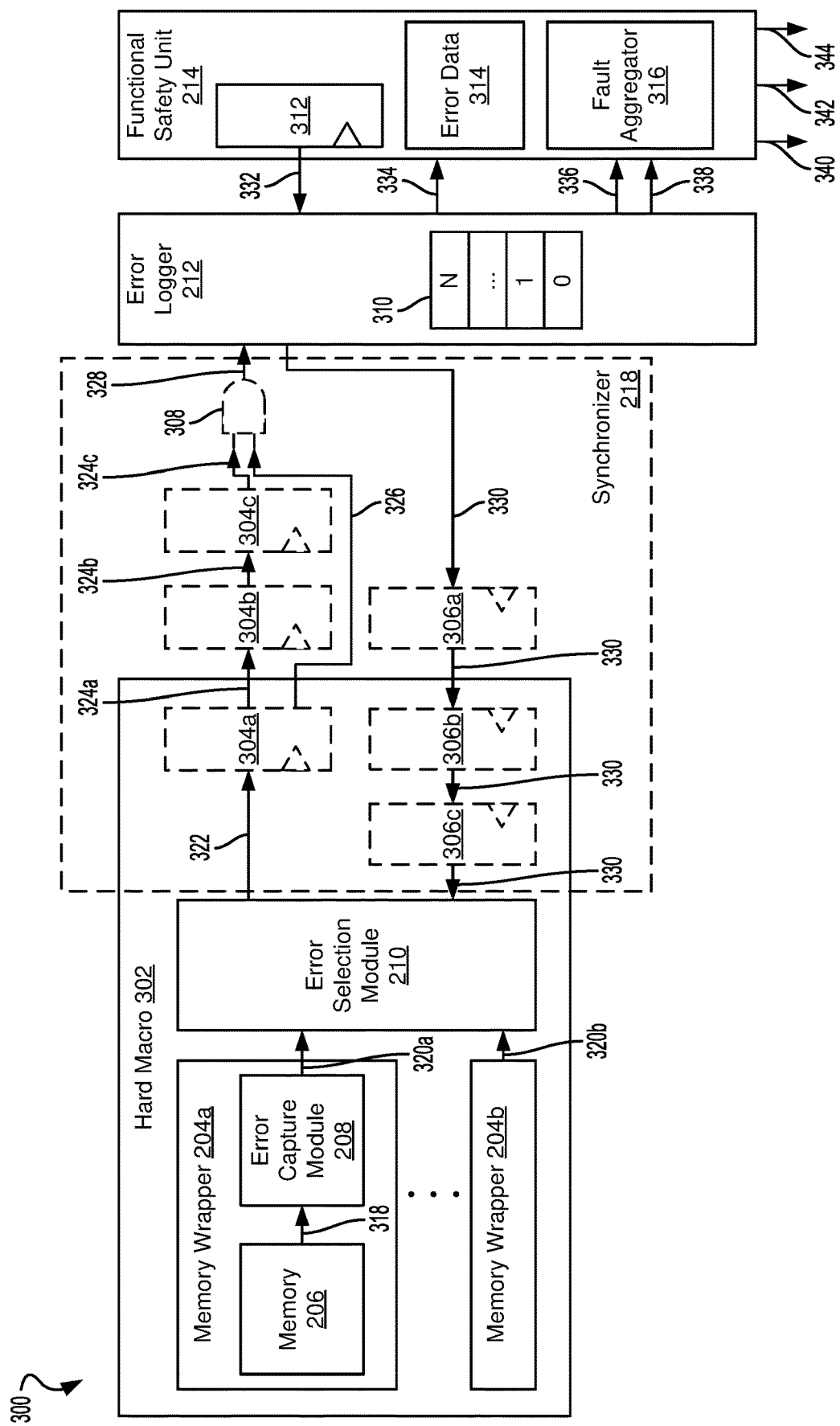
FIG. 3 is a component block diagram illustrating a scalable architecture for error capturing with a single error logger suitable for implementing various embodiments.

FIG. 3 illustrates a scalable error architecture for error capturing with a single error logger suitable for implementing various embodiments. With reference to FIGS. 1-3, the scalable architecture 300 (e.g., scalable architecture 200 in FIG. 2) may include multiple hard macros 302 (e.g., processor 104 in FIG. 1, subsystem discussed herein with reference to FIG. 1, hard macros 202a, 202b in FIG. 2) and the error logger 212 (e.g., error manager 124 in FIG. 1). In some embodiments, the scalable architecture 300 may include the synchronizer 218. In some embodiments, the scalable architecture 300 may include the functional safety unit 214 (e.g., error manager 124 in FIG. 1). The hard macros 302 may include the multiple memory wrappers 204a, 204b, such as two or more. Any of the hard macros 302 may include a same and/or different number of memory wrappers 204a, 204b. Each memory wrapper 204a, 204b may include the memory 206 (e.g., memory 106 in FIG. 1) and the error capture module 208. The memory wrappers 204a, 204b, the memory 206, the error capture module 208, the error logger 212, the synchronizer 218, and the functional safety unit 214 may be structured and function as described with reference to FIG. 2 and further described with reference to FIG. 3.

As described herein, the memory 206 may send error data 318, including a memory fault interrupt and a memory fault signature, to the error capture module 208. The error capture module 208 may send a request to transmit the error data 320a, including the memory fault signature, to the error selection module 210. In a similar manner, an error capture module (not shown) of the memory wrapper 204b may send a request to transmit the error data 320b, including a memory fault signature, to the error selection module 210. The error selection module 210 may retrieve the error data from the error capture module 208 based on a priority of the error capture module 208 and/or request, such as via a round robin manner.

The error selection module 210 may send the error data 322, 326, 328 retrieved from the error capture module 208 to the error logger 212. The error data 322, 326, 328 may be stored by the error logger 212 in a memory 310 (e.g., memory 106 in FIG. 1) in an order relative to other error data received by the error logger. In response to receiving the error data 322, 326, 328, the error logger 212 may send an acknowledgement signal 330a, 330b, 330c, 330d to the error selection module 210. The acknowledgement signal 330a, 330b, 330c, 330d may indicate to the error selection module 210 that a subsequent request to transmit error data may be fulfilled.

The synchronizer 218 may include any number and combination of components of the scalable architecture 300. In some embodiments, the synchronizer 218 may include various sequences of flip flop memories 304a, 304b, 304c, 306a, 306b, 306cm and/or an AND gate 308 as illustrated in FIG. 3. In some examples, any number and combinations of the components of the synchronizer 218 may be separate from and or integral to other components of the scalable architecture 300. The synchronizer 218 may be configured to synchronously transmit data between the error selection module 210 and the error logger 212 operating at different frequencies, or clock cycles. For example, the synchronizer 218 may be configured to synchronously transmit the error data 322, 326, 328 from the error selection module 210 to the error logger 212, and the acknowledgement signal 330a, 330b, 330c, 330d from the error logger 212 to the error selection module 210.

In a nonlimiting example of the synchronizer 218, the error data 322 retrieved from the error capture module 208 and sent from the error selection module 210 may be received at a flip flop memory 304a of the hard macro 302. The flip flop memory 304a may hold the error data 322 and set an error data enable signal 324a in response to receiving the error data. The flip flop memory 304a may hold the error data 322 until receiving a fast clock signal (not shown), and output the error data enable signal 324a to another flip flop memory 304b and the error data 326, including the error signature, to an AND gate 308. The flip flop memory 304b may forward the error data enable signal 324b to another flip flop memory 304c, which may wait for a slow clock signal (not shown) before forwarding the error data enable signal 324c to the AND gate 308. The AND gate 308 may send the error data 328 to the error logger 212. The error data 328 may be the error data 326 combined with the error data enable signal 324c producing the same signal as the error data 326.

The error data enable signal 324a, 324ab. 324c may be implemented to enable asynchronous data transfer protocol where the error data 326 should be stable until the error data 328 is captured at the error logger 212. The enable signal 324a, generated from flip flop memory 304a, may be synchronized by the flip flop memories 304b, 304c and the synchronized error data enable signal 324c may be used as a qualifier to send the error data 326, 328 to error logger 212.

This AND gate 308 may control sending the error data 328 to the error logger 212 based on receipt of the error data enable signal 324c, or until the enable signal 324c is synchronized with the slow clock. In other words, until receipt of the error data enable signal 324c, the AND gate 308 may only output low or zero (0) value signals to the error logger 212. Upon receiving the error data enable signal 324c, a logical AND operation of the error data enable signal 324c and the error data 326 at the AND gate 308 may result in outputting the error data 328 to the error logger 212.

The error data 328 may be stored by the error logger 212 in a memory 310 (e.g., memory 106 in FIG. 1) in an order relative to other error data received by the error logger. In response to receiving the error data 328, the error logger 212 may send an acknowledgement signal 330a, 330b, 330c, 330d to the error selection module 210 via various flip flop memories 306a, 306b, 306c in sequence. The error logger 212 may send an acknowledgement signal 330a to a flip flop memory 306a. The flip flop memory 304a may hold the acknowledgement signal 330a until receiving a slow clock signal (not shown), and output the acknowledgement signal 330b to another flip flop memory 306b. The flip flop memory 306b may forward the acknowledgement signal 330c to another flip flop memory 306c, which may wait for a fast clock signal (not shown) before forwarding the acknowledgement signal 330d to the error selection module 210. The acknowledgement signal 330a, 330b, 330c, 330d may indicate to the error selection module 210 that a subsequent request to transmit error data may be fulfilled.

The error logger 212 may analyze the error data stored at the memory 310 and generate and send to the functional safety unit 214 the error data 334 and at least one interrupt signal 336, 338. Based on the number of faulty bits associated with the error data stored in the memory 310, the error logger 212 may generate an interrupt signal 336 configured as a single bit fault indicator and/or an interrupt signal 338 configured as a double bit fault indicator.

The functional safety unit 214 may receive and store the error data at a memory 314 (e.g., memory 106 in FIG. 1). A fault aggregator 316 of the functional safety unit may receive and analyze the interrupt signal 336, 338 from the error logger 212. The fault aggregator 316 may determine whether an interrupt signal 336, 338 is configured as a single bit fault indicator or as a double bit fault indicator. The fault aggregator 316 may send an interrupt signal 340 to a safety monitor (not shown), and send an error signal 342 in response to determining that the interrupt signal 336 is configured as a single bit fault indicator or send a warning signal 344 in response to determining that the interrupt signal 338 is configured as a double bit fault indicator. The safety monitor may respond to the error signal 342 and the warning signal 344 in different manners.

In some embodiments, the functional safety unit 214 may include a flip flop 312 configured to send an enable signal 332 to the error logger 212. The enable signal 332 may be configured to indicate to the error logger 212 whether the functional safety unit 214 is enabled and available to receive the error data 334 and the interrupt signals 336, 338 from the error logger 212.

The example illustrated in FIG. 3 shows one hard macro 302 connected to the error logger 212 via a set of connection components, including the synchronizer 218, the flip flop memories 304a-304c, 306a-306c, and the AND gate 308, for ease of explanation and clarity, and does not limit the number of hard macros and the sets of connection components that may be connected to the error logger 212 in the claims and the specification. One of skill in the art would understand that any number of hard macros and associated sets of connection components, two or greater, may be connected to the error logger 212. For example, the error logger 212 may be a multichannel interface, and the number of channels may be configured to support the number of hard macros and receive error data from any number of the hard macros in parallel. The example illustrated in FIG. 3 shows two memory wrappers 204a, 204b per hard macro 302 for ease of explanation and clarity, and does not limit the number of memory wrappers per hard macro in the claims and the specification. As described, any number of memory wrappers greater than two may be included as part of a hard macro.

Figure 4:
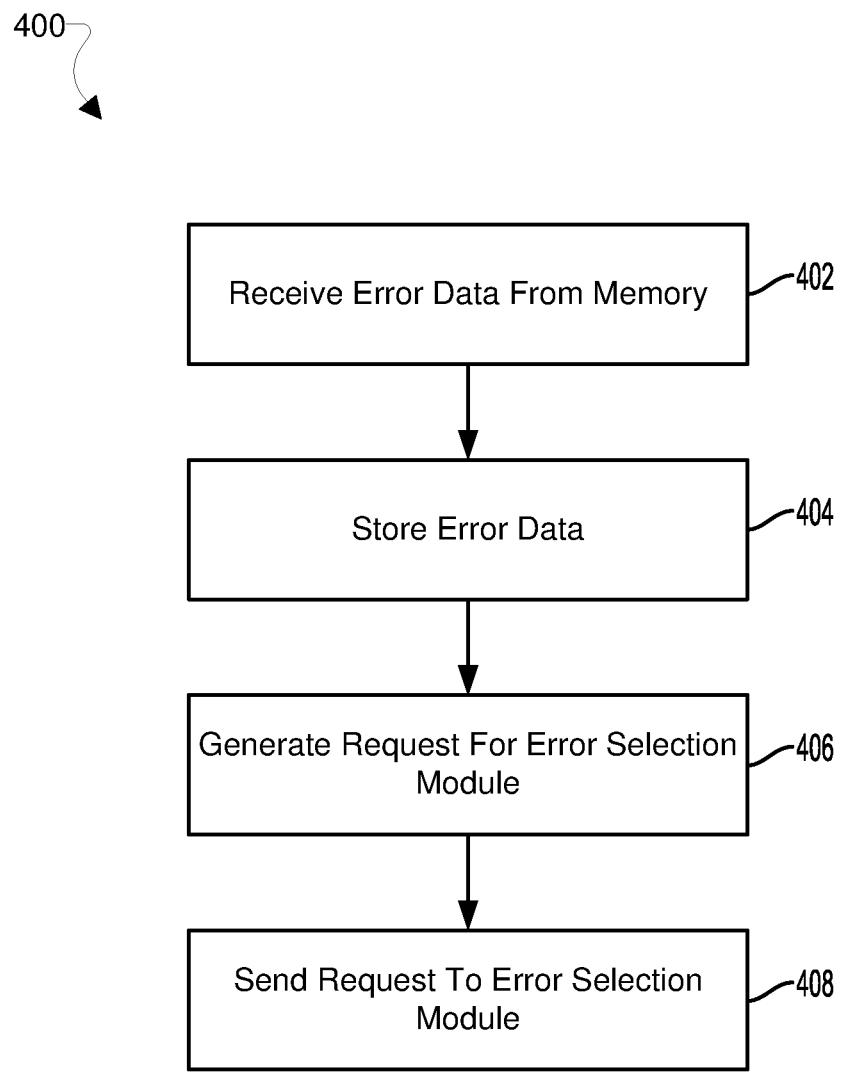
FIG. 4 is a process flow diagram illustrating a method for capturing an error by a scalable architecture for error capturing with a single error logger according to some embodiments.

FIG. 4 illustrates a method 400 for capturing an error by a scalable architecture for error capturing with a single error logger according to some embodiments. With reference to FIGS. 1-4, the method 400 may be implemented in a computing device (e.g., computing device 100), in hardware (e.g., error capture module 208 in FIGS. 2 and 3), in software executing in a processor, or in a combination of a software-configured processor and dedicated hardware (e.g., processor 104 in FIG. 1, hard macro 202a, 202b in FIGS. 2 and 3) that includes other individual components, such as various memories/caches (e.g., memory 106 in FIG. 1, memory 206 in FIGS. 2 and 3) and various memory/cache controllers. In order to encompass the alternative configurations enabled in various embodiments, the hardware implementing the method 400 is referred to herein as an "error processing device." The method 400 may be implemented by multiple processing devices in parallel.

In block 402, the error processing device may receive error data from a memory (e.g., memory 106 in FIG. 1, memory 206 in FIGS. 2 and 3). The memory may suffer from one or more faulty bits resulting in an error and may generate error data, including a memory fault interrupt and a memory fault signature for an error at the memory. The memory fault signature may include information regarding the memory fault, such as a hard macro ID, a memory ID, a memory address, and an ECC status for hard macro (e.g., hard macro 202a, 202b in FIGS. 2 and 3) and memory at which the fault occurs. The ECC status may be configured to indicate a number of bits at a location at which the memory is experiencing the fault. The number of bits may be any number, such as one bit or more, including two bits. The ECC status may indicate a single bit fault for one faulty bit at the location of the memory experiencing the fault. The ECC status may indicate a double bit fault for two faulty bits at the location of the memory experiencing the fault. In some embodiments, the error processing device receiving the error data from the memory in block 402 may be an error capture module (e.g., error capture module 208 in FIGS. 2 and 3).

In block 404, the error processing device may store the error data. The error processing device may include memory (e.g., memory 106 in FIG. 1), such as registers, of sufficient size to store an instance of error data from the memory experiencing the memory fault. The error processing device may store the memory fault signature. In some embodiments, the error processing device storing the error data in block 404 may be the error capture module.

In block 406, the error processing device may generate a request for transmitting the error data to an error selection module (e.g., error selection module 210 in FIGS. 2 and 3). Receiving and/or storing the error data from the memory experiencing the memory fault may trigger the error processing device to generate a signal as a request to transmit the error data to an error selection module. In some embodiments, the signal may include an identifier of the error processing device so that the error selection module may identify a priority of the request and/or error processing device. In some embodiments, the error processing device generating the request for transmitting the error data to the error selection module in block 406 may be the error capture module.

In block 408, the error processing device may send the request to transmit the error data to the error selection module. The error processing device may send the generated signal as the request to transmit the error data to the error selection module. In some embodiments, the signal may include the identifier of the error processing device so that the error selection module may identify a priority of the request and/or error processing device. In some embodiments, the error processing device sending the request to transmit the error data to the error selection module in block 408 may be the error capture module.

Figure 5:
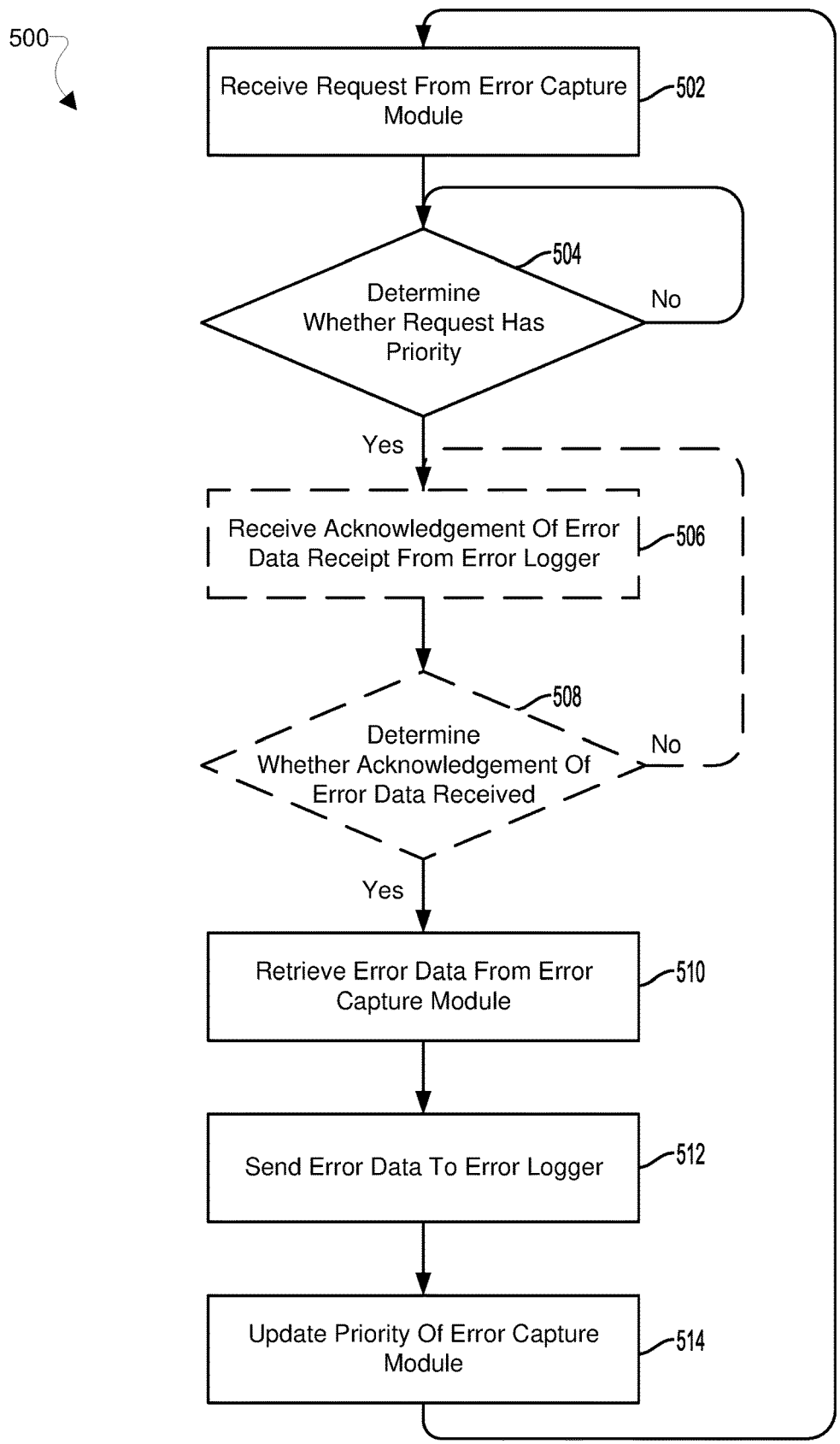
FIG. 5 is a process flow diagram illustrating a method for selecting an error by a scalable architecture for error capturing with a single error logger according to some embodiments.

FIG. 5 illustrates a method 500 for selecting an error by a scalable architecture for error capturing with a single error logger according to some embodiments. With reference to FIGS. 1-5, the method 500 may be implemented in a computing device (e.g., computing device 100), in hardware (e.g., error selection module 210 in FIGS. 2 and 3), in software executing in a processor, or in a combination of a software-configured processor and dedicated hardware (e.g., processor 104 in FIG. 1, hard macro 202a, 202b in FIGS. 2 and 3) that includes other individual components, such as various memories/caches (e.g., memory 106 in FIG. 1, memory 206 in FIGS. 2 and 3) and various memory/cache controllers. In order to encompass the alternative configurations enabled in various embodiments, the hardware implementing the method 500 is referred to herein as an "error processing device." The method 500 may be implemented by multiple processing devices in parallel.

In block 502, the error processing device may receive a request to transmit the error data to the error processing device from an error capture device (e.g., error capture device 208 in FIGS. 2 and 3). The error processing device may receive a signal as a request to transmit the error data from the error capture module. In some embodiments, the signal may include an identifier of the error capture module so that the error processing device may identify a priority of the request and/or error capture module. In some embodiments, the request to transmit the error data may be the request to transmit the error data sent in block 408 of the method 400, described herein with reference to FIG. 4. In some embodiments, the error processing device receiving the request to transmit the error data to the error processing device from the error capture module in block 502 may be an error selection module (e.g., error selection module 210 in FIGS. 2 and 3).

In determination block 504, the error processing device may determine whether the request to transmit error data has priority among other requests to transmit error data. In some embodiments, the error processing device may receive multiple requests to transmit error data, such as in block 502, prior to retrieving error data from an error capture module. The error processing device may prioritize the pending requests to transmit error data. In some embodiments, the request to transmit error data may include an identifier of the error capture module that sent the request. The error processing device may maintain priorities for the error capture modules and match the error capture modules from which the requests to transmit error data are received to respective priorities. The error processing device may compare the priorities of the requests to transmit error data, which may be based on the priorities of the associated error capture modules, to determine which request to transmit error data has priority. In some embodiments, the error processing module determining whether the request to transmit error data has priority among the other requests to transmit error data in determination block 504 may be the error selection module.

In response to determining that the request to transmit error data does not have priority (i.e., determination block 504="No"), the error processing device may again determine whether the request to transmit error data has priority among the other requests to transmit error data in determination block 504. In response to determining that the request to transmit error data has priority (i.e., determination block 504="Yes"), the error processing device may receive an acknowledgement signal of error data receipt from an error logger (e.g., error logger 212 in FIGS. 2 and 3) in optional block 506. The error processing device may be configured to handle a limited amount of error data, such as few a one error data from an error capture module at a time. While the error processing device is handling an error data, the error processing device may not be able to handle other error data. Once the error processing device receives the acknowledgement of receipt of the error data, the error processing device may no longer need to handle the error data and may transition to handling another error data. In some embodiments, receiving the acknowledgement signal of error data receipt from an error logger may be optional, as such an acknowledgement may not need to be prior to the error processing device having handled any error data, such as for a session of error management for the error processing device. For example, a session of error management may begin in a computing device (e.g., computing device 100 in FIG. 1) in which the error processing device resides after the computing device is turned on. In this situation, the error processing device has yet to send error data to the error logger during the session. In another example, the receiving the acknowledgement signal of error data receipt from an error logger may be optional as other blocks of the method 500, such as optional determination block 506, may execute regardless of whether optional block 506 is implemented. In some embodiments, the error processing device receiving an acknowledgement signal of error data receipt from an error logger in optional block 506 may be the error selection module.

In optional determination block 508, the error processing device may determine whether the acknowledgement of receipt of the error data is received. As discussed herein, the error processing device may not handle additional error data until handling of a current error data is complete, which may be signaled by the receipt of the acknowledgement of receipt of the error data. In some embodiments, the error processing device determining whether the acknowledgement of receipt of the error data is received in optional determination block 508 may be the error selection module.

In response to determining that an acknowledgement of receipt of the error data is not received (i.e., optional determination block 508="No"), the error processing device may again receive an acknowledgement signal of error data receipt from an error logger in optional block 506.

In response to determining that an acknowledgement of receipt of the error data is received (i.e., optional determination block 508="Yes"); or in response to determining that the request to transmit error data has priority (i.e., determination block 504="Yes"), the error processing device may retrieve error data from the error capture module in block 510. The error processing device may retrieve error data for the request to transmit error data having priority among other requests to transmit error data. The error data retrieved from the error capture module may include the memory fault signature for an error at a memory (e.g., memory 106 in FIG. 1, memory 206 in FIGS. 2 and 3). In some embodiments, the error processing device retrieving the error data from the error capture module in block 510 may be the error selection module In block 512, the error processing device may send the error data to the error logger. The error data sent to the error logger may include the memory fault signature. In some embodiments, the error processing device sending the error data to the error logger in block 512 may be the error selection module.

In block 514, the error processing device may update priority of the error capture modules. In some embodiments, the error capture modules may be associated with (e.g., assigned) a priority. The error processing device may alter the priority of the error capture modules based on when requests are received from the error capture modules relative to when requests are received from other error capture modules, sending error data for an error capture module, and or/or receiving an acknowledgement of receipt of error data. In some embodiments, altering the priority may involve managing priority of the error capture modules in a round robin manner in which priority is shifted among a group of error capture modules based on one of the foregoing criteria. In some embodiments, the error processing device updating the priority of the error capture modules in block 514 may be the error selection module.

Figure 6:
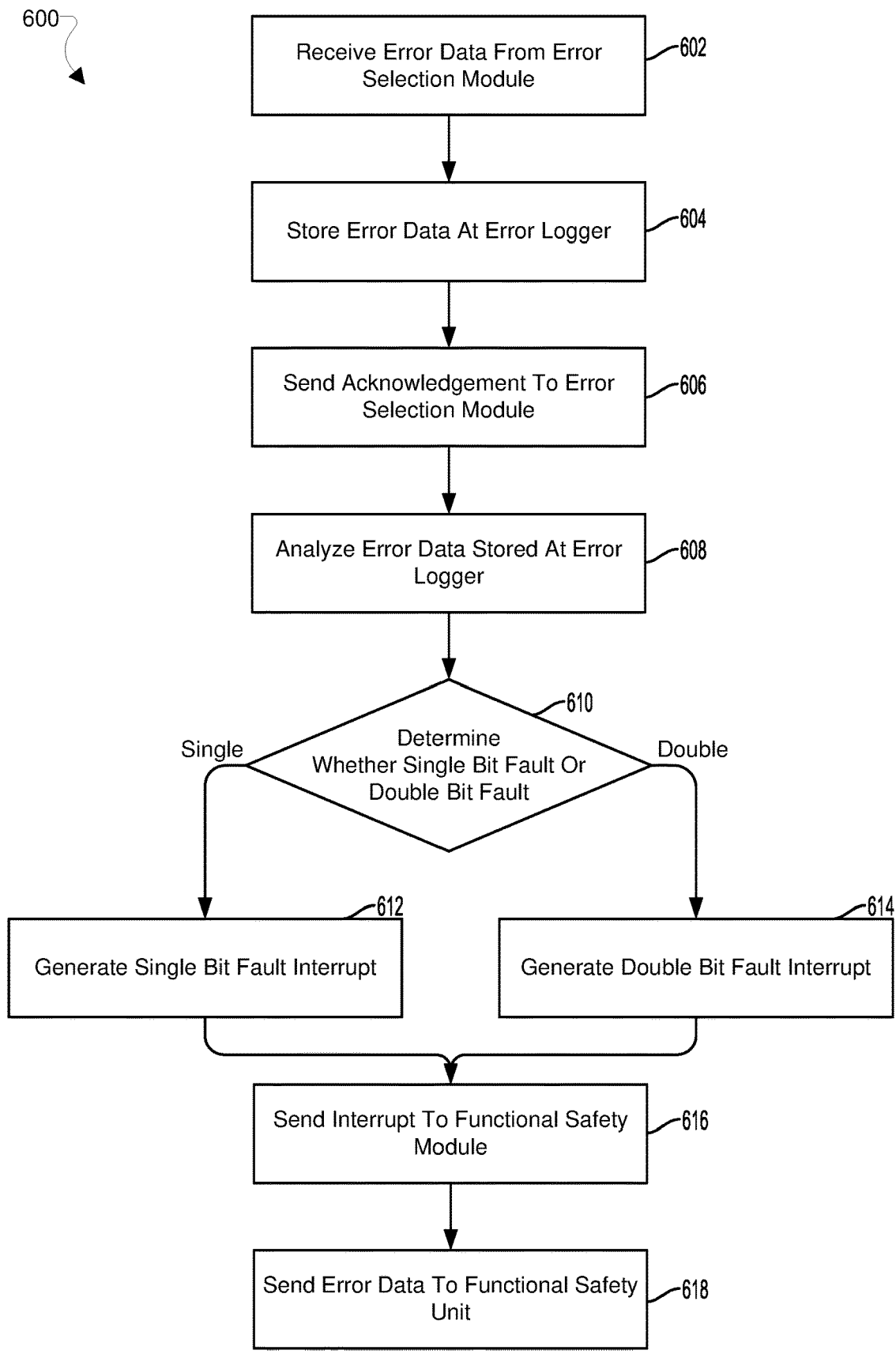
FIG. 6 is a process flow diagram illustrating a method for logging an error by a scalable architecture for error capturing with a single error logger according to some embodiments.

FIG. 6 illustrates a method 600 for logging an error by a scalable architecture for error capturing with a single error logger according to some embodiments. With reference to FIGS. 1-6, the method 600 may be implemented in a computing device (e.g., computing device 100), in hardware (e.g., error logger 212 in FIGS. 2 and 3), in software executing in a processor, or in a combination of a software-configured processor and dedicated hardware (e.g., processor 104 in FIG. 1) that includes other individual components, such as various memories/caches (e.g., memory 106 in FIG. 1, memory 206 in FIGS. 2 and 3) and various memory/cache controllers. In order to encompass the alternative configurations enabled in various embodiments, the hardware implementing the method 600 is referred to herein as an "error processing device."

In block 602, the error processing device may receive error data from an error selection module (e.g., error selection module 210 in FIGS. 2 and 3). The error data may include a memory fault signature for an error at a memory (e.g., memory 106 in FIG. 1, memory 206 in FIGS. 2 and 3). For example, the error data may be the error data sent in block 512 of the method 500, described herein with reference to FIG. 5. In some embodiments, the error processing device receiving the error data from the selection module in block 602 may be an error logger (e.g., error logger 212 in FIGS. 2 and 3).

In block 604, the error processing device may store the error data at the error logger. The error data may be stored by the error processing device in a memory (e.g., memory 106 in FIG. 1, memory 310 in FIG. 3) in an order relative to other error data received by the error processing device. In some embodiments, the error processing device storing the error data at the error logger in block 604 may be the error logger.

In block 606, the error processing device may send an acknowledgement of receipt of the error data to the error selection module. The acknowledgement may indicate to the error selection module that the error selection module need not continue to hold the error data to provide to the error processing device and that a subsequent request to transmit error data may be fulfilled. In some embodiments, the error processing device sending the acknowledgement of receipt of the error data to the error selection module in block 606 may be the error logger.

In block 608, the error processing device may analyze the error data stored at the error logger. The error data may include information, such as the ECC stats, indicating to the error processing device a number of faulty bits in a location of the memory. For example, the error processing device may parse out the indication of the number of faulty bits from the error data. In some embodiments, the error processing device analyzing the error data stored at the error logger in block 608 may be the error logger.

In determination block 610, the error processing device may determine whether the error data indicates a single bit fault or a double bit fault. The error processing device may know the information of the error data indicating the number of faulty bits of the location of the memory from the analysis of the error data in block 608. From the information resulting from the analysis of the error data, the error processing device may determine whether the error data indicates a single bit fault or a double bit fault. In some embodiments, the error processing device determining whether the error data indicates a single bit fault or a double bit fault in determination block 610 may be the error logger.

In response to determining that the error data indicates a single bit error (i.e., determination block 610="Single"), the error processing device may generate a single bit fault interrupt in block 612. The interrupt may be a signal configured to indicate to a functional safety unit (e.g., functional safety unit 214 in FIGS. 2 and 3) that the error at the location in the memory is caused by a single bit fault. In some embodiments, the error processing device generating the single bit fault interrupt in block 612 may be the error logger.

In response to determining that the error data indicates a double bit error (i.e., determination block 610="double"), the error processing device may generate a double bit fault interrupt in block 614. The interrupt may be a signal configured to indicate to the functional safety unit that the error at the location in the memory is caused by a double bit fault. In some embodiments, the error processing device generating the double bit fault interrupt in block 614 may be the error logger.

In block 616, the error processing device may send the interrupt to the functional safety unit. Depending on the result of the determination block 610, the error processing device may have either the single bit fault interrupt generated in block 612 or the double bitt fault interrupt generated in block 614 available to send. Regardless of whether the single bit fault interrupt or the double bit fault interrupt is available to send, the error processing device may send the available generated interrupt to the functional safety unit. In some embodiments, the error processing device sending the interrupt to the functional safety unit in block 616 may be the error logger.

In block 618, the error processing device may send the error data to the functional safety unit. The error data may be at least one of the error data stored at the error logger that is analyzed in block 608 to determine which interrupt to generate. In other words, the error data is associated with the interrupt generated and sent to the functional safety unit. The error data may include the memory fault signature. In some embodiments, the error processing device sending the error data to the functional safety unit in block 618 may be the error logger.

Figure 7:
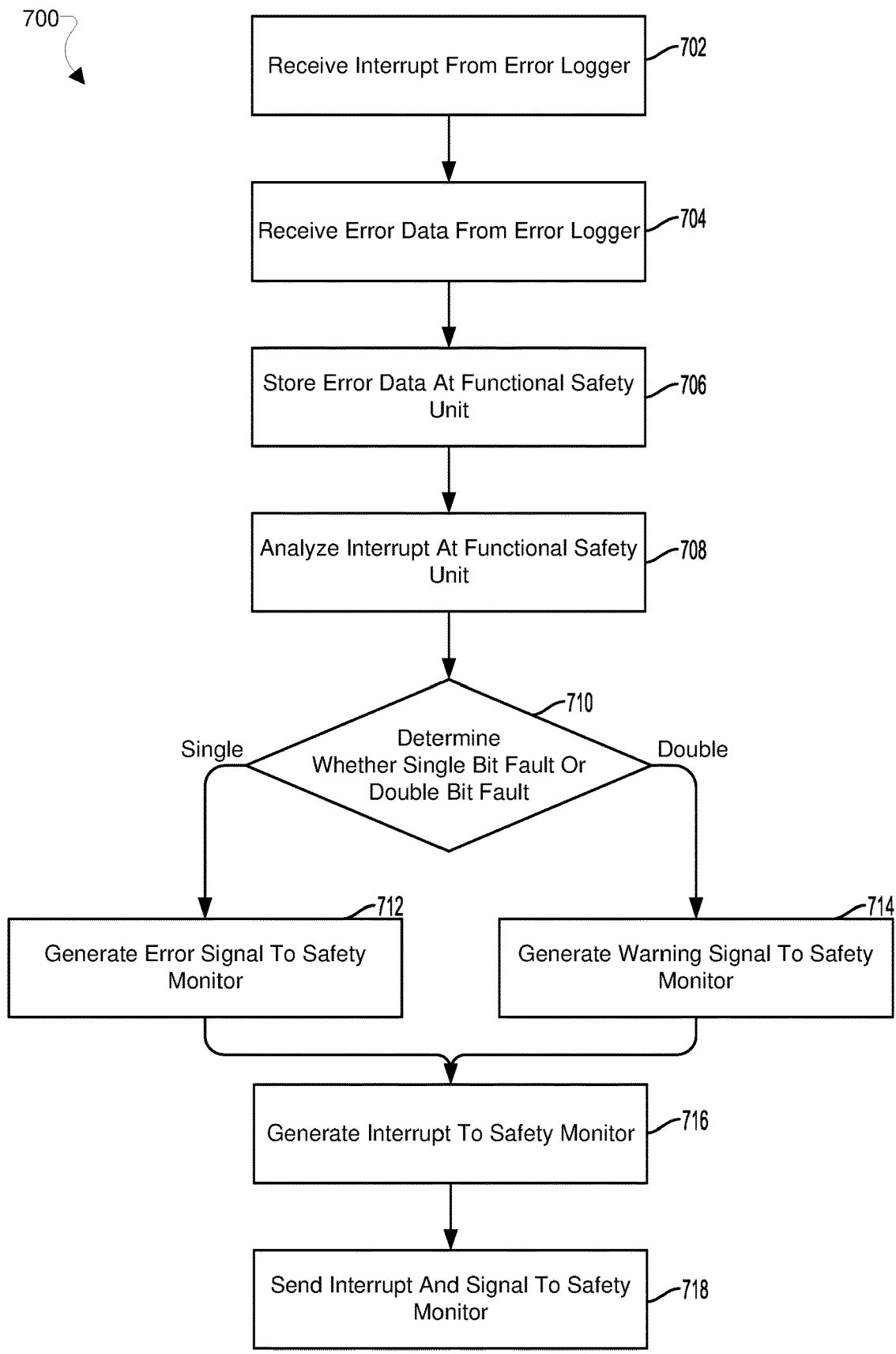
FIG. 7 is a process flow diagram illustrating a method for notifying of an error by a scalable architecture for error capturing with a single error logger according to some embodiments.

FIG. 7 illustrates a method 700 for notifying of an error by a scalable architecture for error capturing with a single error logger according to some embodiments. With reference to FIGS. 1-7, the method 700 may be implemented in a computing device (e.g., computing device 100), in hardware (e.g., functional safety unit 214 in FIGS. 2 and 3), in software executing in a processor, or in a combination of a software-configured processor and dedicated hardware (e.g., processor 104 in FIG. 1) that includes other individual components, such as various memories/caches (e.g., memory 106 in FIG. 1, memory 206 in FIGS. 2 and 3) and various memory/cache controllers. In order to encompass the alternative configurations enabled in various embodiments, the hardware implementing the method 700 is referred to herein as an "error processing device."

In block 702, the error processing device may receive an interrupt from an error logger (e.g., error logger 212 in FIGS. 2 and 3). The interrupt may be the interrupt sent in block 616 of the method 600, described herein with reference to FIG. 6. The interrupt may be a single bit fault interrupt configured to indicate to the error processing device that an error at a location of a memory (e.g., memory 106 in FIG. 1, memory 206 in FIGS. 2 and 3) is due to a single bit fault. The interrupt may be a double bit fault interrupt configured to indicate to the error processing device that the error at the location of the memory is due to a double bit fault. In some embodiments, the error processing device receiving the interrupt from the error logger in block 702 may be a functional safety unit (e.g., functional safety unit 214 in FIGS. 2 and 3).

In block 704, the error processing device may receive an error data from the error logger. The error data may be the error data sent in block 618 of the method 600, described herein with reference to FIG. 6. The error data may include a memory fault signature for an error at the memory. In some embodiments, the error processing device receiving the interrupt from the error logger in block 704 may be a functional safety unit (e.g., functional safety unit 214 in FIGS. 2 and 3).

In block 706, the error processing device may store the error data at the functional safety unit. The error data may be stored by the error processing device in a memory (e.g., memory 106 in FIG. 1, memory 314 in FIG. 3). In some embodiments, the error processing device storing the error data at the functional safety unit in block 706 may be the functional safety unit.

In block 708, the error processing device may analyze the received interrupt. The interrupt may be the single bit fault interrupt or the double bit fault interrupt. Based on the interrupt received, the error processing device may know how many bits of the location of the memory are faulty. For example, the error processing device may determine the number of faulty bits from the indication provided by the type of interrupt. In some embodiments, the error processing device analyzing the received interrupt in block 708 may be the functional safety unit.

In determination block 710, the error processing device may determine whether the interrupt indicates a single bit fault or a double bit fault. The error processing device may know the number of faulty bits of the location of the memory from the analysis of the interrupt in block 708. From the analysis of the interrupt, the error processing device may determine whether the interrupt indicates a single bit fault or a double bit fault. In some embodiments, the error processing device determining whether the interrupt indicates a single bit fault or a double bit fault in determination block 710 may be the functional safety unit.

In response to determining that the interrupt indicates a single bit error (i.e., determination block 710="Single"), the error processing device may generate an error signal in block 712. The error signal may be a signal configured to indicate to a safety monitor that the error at the location in the memory is caused by a single bit fault so that the safety monitor may handle the error according to procedures for a single bit fault. In some embodiments, the error processing device generating the error signal in block 712 may be the functional safety unit.

In response to determining that the interrupt indicates a double bit error (i.e., determination block 710="double"), the error processing device may generate a warning signal in block 714. The warning signal may be a signal configured to indicate to the safety monitor that the error at the location in the memory is caused by a double bit fault so that the safety monitor may handle the error according to procedures for a double bit fault. In some embodiments, the error processing device generating the warning signal in block 714 may be the functional safety unit.

In block 716, the error processing device may generate an interrupt to the safety monitor. The interrupt may be a signal configured to notify the safety monitor of the error occurring in the memory and to retrieve error data stored at the functional safety unit so that the safety monitor may handle the error using the error data for the error at the memory. In some embodiments, the error processing device generating the interrupt to the safety monitor in block 716 may be the functional safety unit.

In block 718, the error processing device may send the interrupt and the signal to the safety monitor. Depending on the result of the determination block 710, the error processing device may have either the error signal generated in block 712 or the warning signal generated in block 614 available to send. Regardless of whether the error signal or the warning signal is available to send, the error processing device may send the available generated signal and interrupt to the safety monitor. In some embodiments, the error processing device sending the interrupt and the signal to the safety monitor in block 718 may be the functional safety unit.

Figure 8:
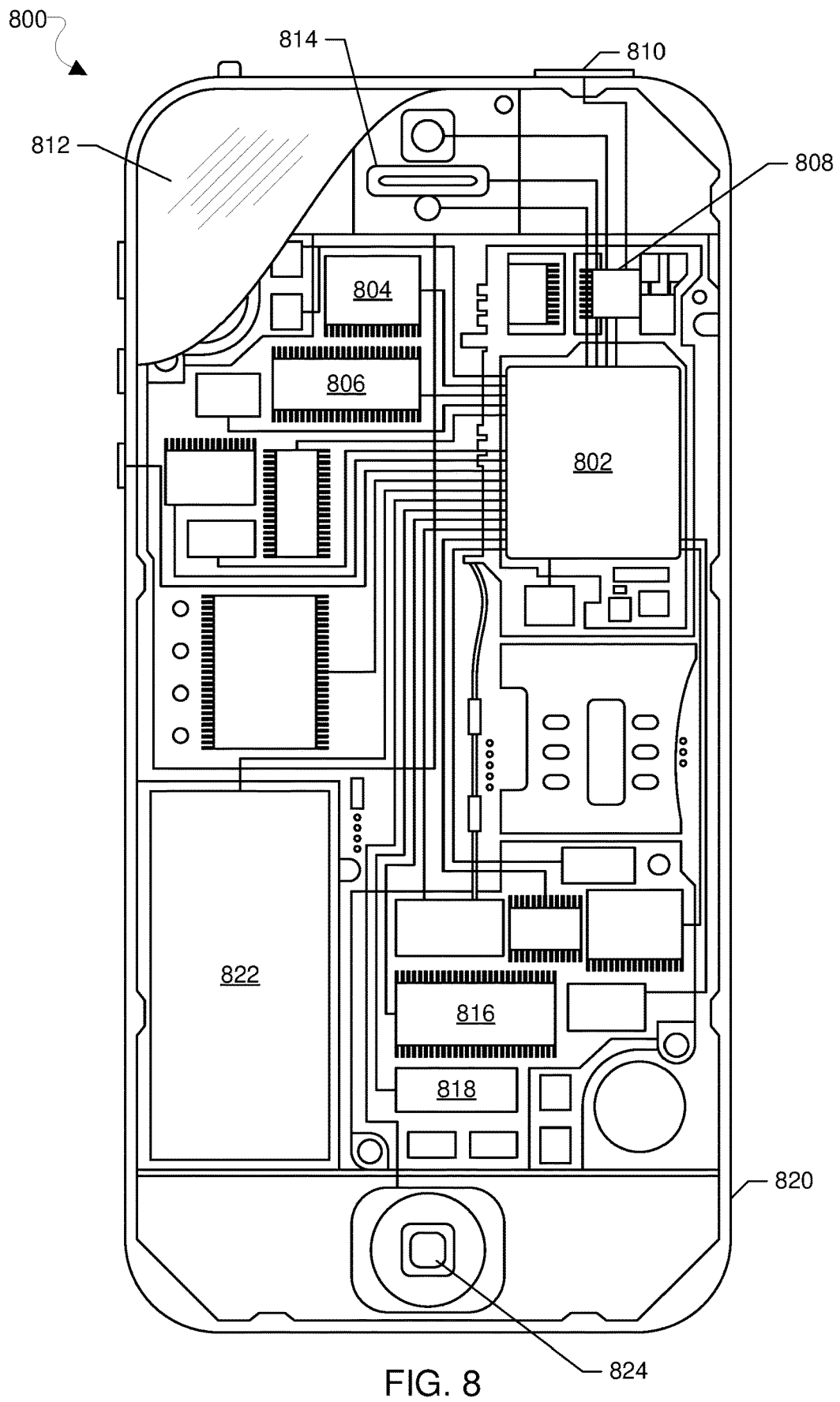
FIG. 8 is a component block diagram illustrating an example mobile computing device suitable for implementing various embodiments.

A system in accordance with the various embodiments (including, but not limited to, embodiments described above with reference to FIGS. 1-7) may be implemented in a wide variety of computing systems including mobile computing devices, an example of which suitable for use with the various embodiments is illustrated in FIG. 8. The mobile computing device 800 may include a processor 802 coupled to a touchscreen controller 804 and an internal memory 806. The processor 802 may be one or more multicore integrated circuits designated for general or specific processing tasks. The internal memory 806 may be volatile or non-volatile memory, and may also be secure and/or encrypted memory, or unsecure and/or unencrypted memory, or any combination thereof. Examples of memory types that can be leveraged include but are not limited to DDR, LPDDR, GDDR, WIDEIO, RAM, SRAM, DRAM, P-RAM, R-RAM, M-RAM, STT-RAM, and embedded DRAM. The touchscreen controller 804 and the processor 802 may also be coupled to a touchscreen panel 812, such as a resistive-sensing touchscreen, capacitive-sensing touchscreen, infrared sensing touchscreen, etc. Additionally, the display of the mobile computing device 800 need not have touch screen capability.

The mobile computing device 800 may have one or more radio signal transceivers 808 (e.g., Peanut, Bluetooth, ZigBee, Wi-Fi, RF radio) and antennae 810, for sending and receiving communications, coupled to each other and/or to the processor 802. The transceivers 808 and antennae 810 may be used with the above-mentioned circuitry to implement the various wireless transmission protocol stacks and interfaces. The mobile computing device 800 may include a cellular network wireless modem chip 816 that enables communication via a cellular network and is coupled to the processor.

The mobile computing device 800 may include a peripheral device connection interface 818 coupled to the processor 802. The peripheral device connection interface 818 may be singularly configured to accept one type of connection, or may be configured to accept various types of physical and communication connections, common or proprietary, such as Universal Serial Bus (USB), FireWire, Thunderbolt, or PCIe. The peripheral device connection interface 818 may also be coupled to a similarly configured peripheral device connection port (not shown).

The mobile computing device 800 may also include speakers 814 for providing audio outputs. The mobile computing device 800 may also include a housing 820, constructed of a plastic, metal, or a combination of materials, for containing all or some of the components described herein. The mobile computing device 800 may include a power source 822 coupled to the processor 802, such as a disposable or rechargeable battery. The rechargeable battery may also be coupled to the peripheral device connection port to receive a charging current from a source external to the mobile computing device 800. The mobile computing device 800 may also include a physical button 824 for receiving user inputs. The mobile computing device 800 may also include a power button 824 for turning the mobile computing device 800 on and off.

Figure 9:
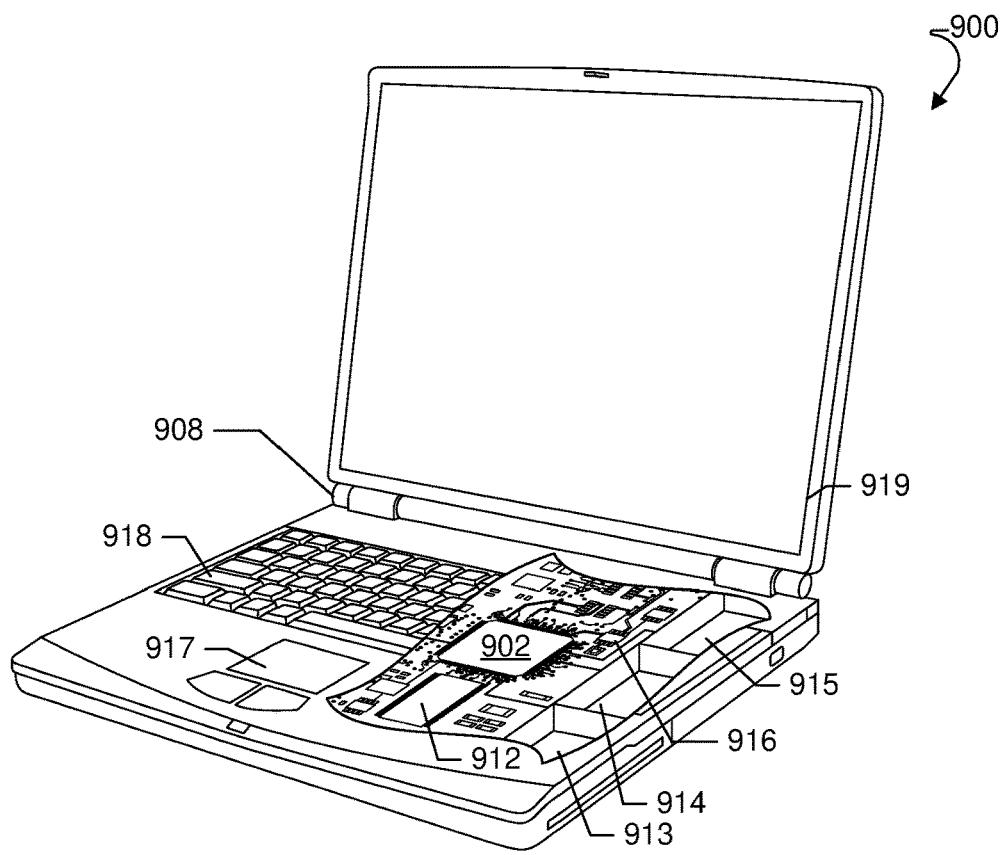
FIG. 9 is a component block diagram illustrating an example mobile computing device suitable for implementing various embodiments.

A system in accordance with the various embodiments (including, but not limited to, embodiments described above with reference to FIGS. 1-7) may be implemented in a wide variety of computing systems including a laptop computer 900 an example of which is illustrated in FIG. 9. Many laptop computers include a touchpad touch surface 917 that serves as the computer's pointing device, and thus may receive drag, scroll, and flick gestures similar to those implemented on computing devices equipped with a touch screen display and described above. A laptop computer 900 will typically include a processor 902 coupled to volatile memory 912 and a large capacity nonvolatile memory, such as a disk drive 913 of Flash memory. Additionally, the computer 900 may have one or more antenna 908 for sending and receiving electromagnetic radiation that may be connected to a wireless data link and/or cellular telephone transceiver 916 coupled to the processor 902. The computer 900 may also include a floppy disc drive 914 and a compact disc (CD) drive 915 coupled to the processor 902. In a notebook configuration, the computer housing includes the touchpad 917, the keyboard 918, and the display 919 all coupled to the processor 902. Other configurations of the computing device may include a computer mouse or trackball coupled to the processor (e.g., via a USB input) as are well known, which may also be used in conjunction with the various embodiments.

Figure 10:
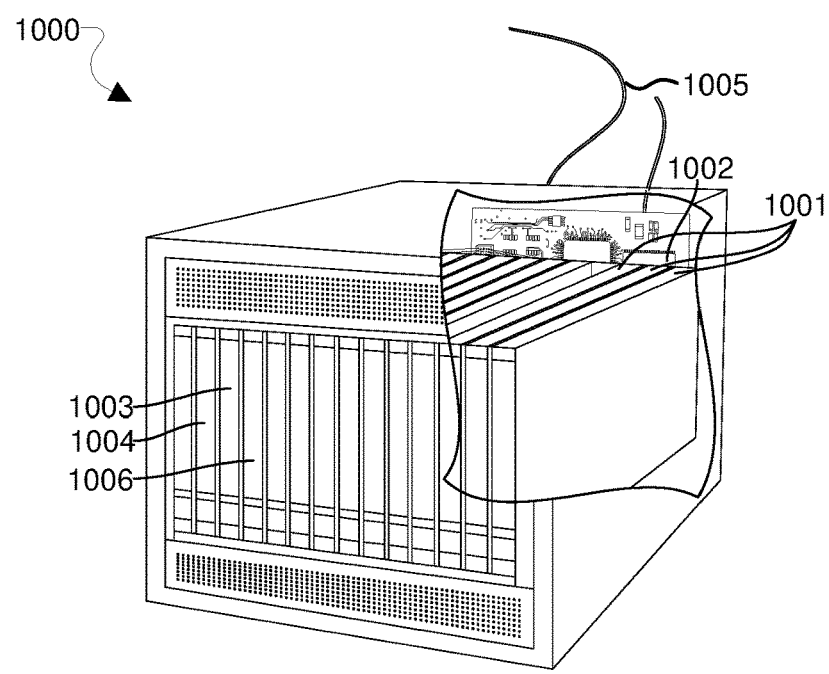
FIG. 10 is a component block diagram illustrating an example server suitable for implementing various embodiments.

A system in accordance with the various embodiments (including, but not limited to, embodiments described above with reference to FIGS. 1-7) may also be implemented in fixed computing systems, such as any of a variety of commercially available servers. An example server 1000 is illustrated in FIG. 10. Such a server 1000 typically includes one or more multicore processor assemblies 1001 coupled to volatile memory 1002 and a large capacity nonvolatile memory, such as a disk drive 1004. As illustrated in FIG. 10, multicore processor assemblies 1001 may be added to the server 1000 by inserting them into the racks of the assembly. The server 1000 may also include a floppy disc drive, compact disc (CD) or digital versatile disc (DVD) disc drive 1006 coupled to the processor 1001. The server 1000 may also include network access ports 1003 coupled to the multicore processor assemblies 1001 for establishing network interface connections with a network 1005, such as a local area network coupled to other broadcast system computers and servers, the Internet, the public switched telephone network, and/or a cellular data network (e.g., CDMA, TDMA, GSM, PCS, 3G, 4G, LTE, 5G or any other type of cellular data network).

Figure 11A:
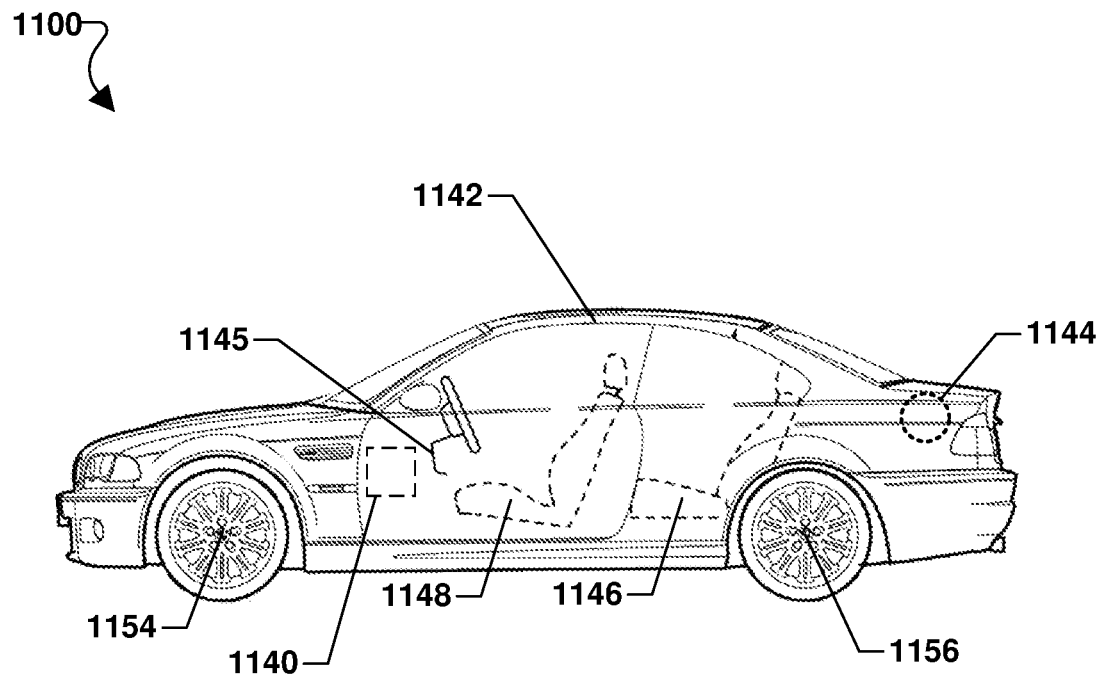
FIGS. 11A-11C are component block diagrams illustrating an example embedded vehicle computing system suitable for implementing various embodiments.
Figure 11B:
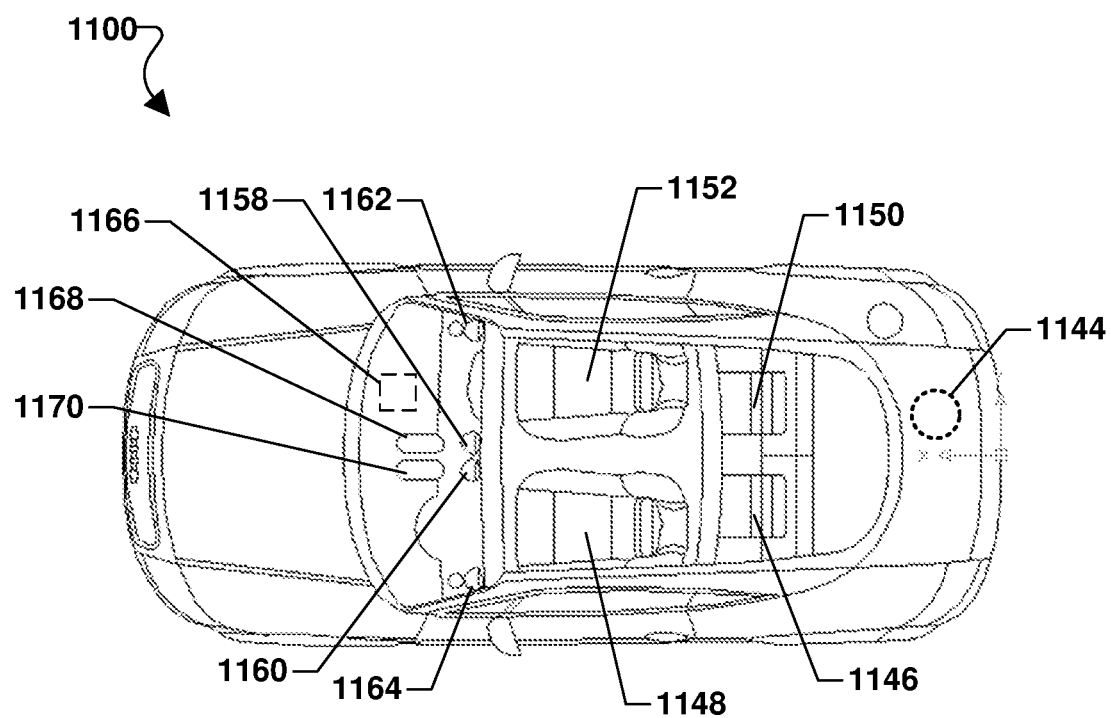
Figure 11C:
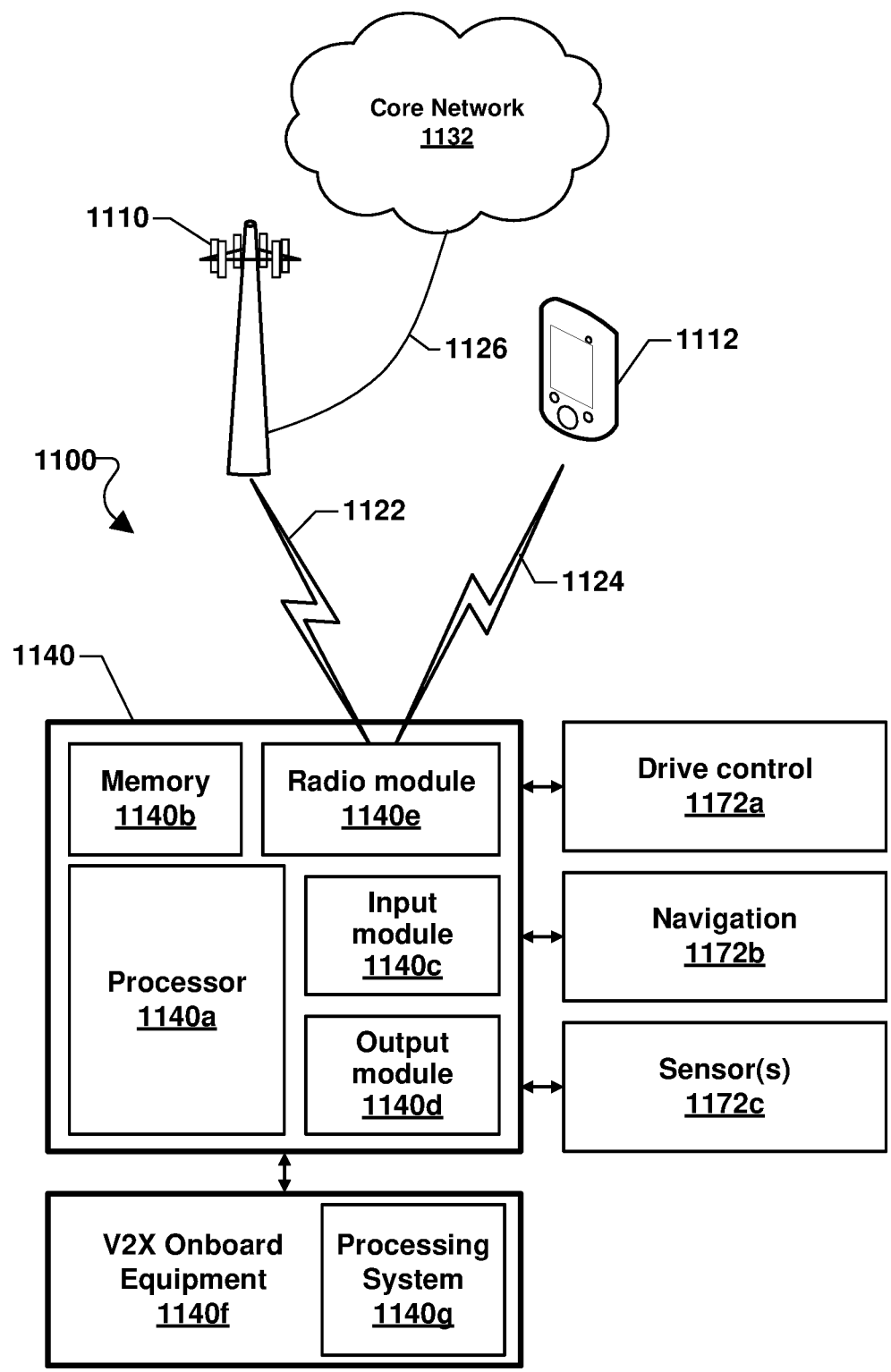

Methods and devices for implementing such methods in accordance with the various embodiments (including, but not limited to, embodiments described above with reference to FIGS. 1-7) may be implemented in a wide variety of computing systems including an embedded vehicle computing system 1100 an example of which is illustrated in FIGS. 11A-11C. An embedded vehicle computing system 1100 may include a vehicle control unit 1140, such as an ECU, which may include a processor, such as a CPU, an AI processor, etc. The embedded vehicle computing system 1100 may include a plurality of sensors 1142-1170, including satellite geopositioning system receivers 1142, accelerometers 1144, occupancy sensors 1146, 1148, 1150, 1152, tire pressure sensors 1154, 1156, cameras 1158, 1160, microphones 1162, 1164, impact sensors 1166, and object detection and ranging sensors 1168, 1170.

The plurality of sensors 1142-1170, disposed in or on the vehicle, may be used for various purposes, such as autonomous and semi-autonomous navigation and control, crash avoidance, position determination, etc., as well to provide sensor data regarding objects and people in or on the vehicle. The sensors 1142-1170 may include one or more of a wide variety of sensors capable of detecting a variety of information useful for navigation and collision avoidance. Each of the sensors 1142-1170 may be in wired or wireless communication with a control unit 1140, as well as with each other. In particular, the sensors may include one or more cameras 1158, 1160 or other optical sensors or photo optic sensors. The sensors may further include other types of object detection and ranging sensors 1168, 1170 (e.g., IR sensors, and ultrasonic sensors). The sensors may further include tire pressure sensors 1154, 1156, humidity sensors, temperature sensors, satellite geopositioning sensors 1142, control input sensors 1145, accelerometers 1144, vibration sensors, gyroscopes, gravimeters, impact sensors 1166, force meters, stress meters, strain sensors, fluid sensors, chemical sensors, gas content analyzers, pH sensors, radiation sensors, Geiger counters, neutron detectors, biological material sensors, microphones 1162, 1164, occupancy sensors 1146, 1148, 1150, 1152, proximity sensors, and other sensors.

The vehicle control unit 1140 may include one or more processors configured with processor-executable instructions to perform navigation and collision avoidance operations using information received from various sensors, particularly the cameras 1158, 1160. In some embodiments, the control unit 1140 may supplement the processing of camera images using distance and relative position (e.g., relative bearing angle) that may be obtained from object detection and ranging sensors 1168, 1170 sensors. The control unit 1140 may further be configured to control steering, braking and speed of the vehicle when operating in an autonomous or semi-autonomous mode using information regarding other vehicles determined using various embodiments. The vehicle control unit 1140 may include one or more processors configured with processor-executable instructions to receive information from the sensors 1142-1170 and to perform operations using such information as further described herein. In various embodiments, the vehicle control unit 1140 may include, be a component of, or communicate with V2X onboard equipment of the vehicle.

FIG. 11C is a component block diagram illustrating the embedded vehicle computing system 1100 including components and support systems suitable for implementing various embodiments. The embedded vehicle computing system 1100 may include the control unit 1140, which may include various circuits and devices used to control the operation of the vehicle. The control unit 1140 may include a processor 1140a, such as a CPU, an AI processor, etc., a memory 1140b, an input module 1140c, an output module 1140d, and a radio module 1140e. The control unit 1140 may be coupled to and configured to control drive control components 1172a, navigation components 1172b, and one or more sensors 1172c of the embedded vehicle computing system 1100. The control unit 1140 may communicate with V2X onboard equipment 1140f. The processor 1140a may be configured with processor-executable instructions to control maneuvering, navigation, and/or other operations of the vehicle, including operations of various embodiments, including gathering and analyzing real-world autonomous vehicle run data gathered from the sensors 1172c. The processor 1140a may be coupled to the memory 1140b. The V2X onboard equipment 1140f may include one or more processors 1140g configured with processor-executable instructions to perform various operations of various embodiments, including communicating real-world autonomous vehicle run data gathered from the sensors 1172c between the embedded vehicle computing system 1200 and a wireless communication device 1112 and/or the computing device on a communication network (e.g., a core network 1132) via the radio module 1140e.

The radio module 1140e may be configured for wireless communication. The radio module 1140e may exchange signals (e.g., command signals for controlling maneuvering, signals from navigation facilities, data signals, etc.) via a communication link 1122 with a network transceiver (e.g., the base station 1110), and may provide the signals to the processor 1140a, 1140g and/or the navigation unit 1172b. In some embodiments, the radio module 1140e may enable the embedded vehicle computing system 1100 to communicate with a wireless communication device 1112 through the wireless communication link 1124. The wireless communication link 1124 may be a bidirectional or unidirectional communication link and may use one or more communication protocols.

The input module 1140c may receive sensor data from one or more vehicle sensors 1172c as well as electronic signals from other components, including the drive control components 1172a and the navigation components 1172b. The output module 1140d may communicate with or activate various components of the embedded vehicle computing system 1100, including the drive control components 1172a, the navigation components 1172b, and the sensor(s) 1172c.

The control unit 1140 may be coupled to the drive control components 1172a to control physical elements of the vehicle related to maneuvering and navigation of the vehicle, such as the engine, motors, throttles, steering elements, flight control elements, braking or deceleration elements, and the like. The drive control components 1172a may also include components that control other devices of the vehicle, including interior environment controls (e.g., air conditioning and heating), external and/or interior lighting, interior and/or exterior informational displays (which may include a display screen or other devices to display information), safety devices (e.g., haptic devices, audible alarms, etc.), and other similar devices.

The control unit 1140 may be coupled to the navigation components 1172b, and may receive data from the navigation components 1172b and be configured to use such data to determine the present position and orientation of the vehicle, as well as an appropriate course toward a destination. The navigation components 1172b may include or be coupled to a global navigation satellite system (GNSS) receiver system (e.g., one or more Global Positioning System (GPS) receivers) enabling the embedded vehicle computing system 800 to determine its current position using GNSS signals. Alternatively, or in addition, the navigation components 1172b may include radio navigation receivers for receiving navigation beacons or other signals from radio nodes, such as Wi-Fi access points, cellular network sites, radio station, remote computing devices, other vehicles, etc. Through control of the drive control elements 1172a, the processor 1140a may control the vehicle to navigate and maneuver. The processor 1140a, 1140g and/or the navigation components 1172b may be configured to communicate with a network element such as a server in a communication network (e.g., a core network 1132) via the wireless communication link 1122, 1126 to receive commands to control maneuvering, receive data useful in navigation, provide real-time position reports, etc.

The control unit 1140 may be coupled to one or more sensors 1172c. The sensor(s) 1172c may include the sensors 1142-1170 as described, and may the configured to provide a variety of data to the processor 1140a, 1140g.

While the control unit 1140 is described as including separate components, in some embodiments some or all of the components (e.g., the processor 1140a, the memory 1140b, the input module 1140c, the output module 1140d, and the radio module 1140e) may be integrated in a single device or module, such as an SoC processing device. Such an SoC processing device may be configured for use in vehicles and be configured, such as with processor-executable instructions executing in the processor 1140a, to perform operations of navigation and collision avoidance.

Implementation examples are described in the following paragraphs. While some of the following implementation examples are described in terms of example methods, further example implementations may include: the example methods discussed in the following paragraphs implemented by a computing device comprising a processor configured with processor-executable instructions to perform operations of the example methods; the example methods discussed in the following paragraphs implemented by a computing device including means for performing functions of the example methods; and the example methods discussed in the following paragraphs implemented as a non-transitory processor-readable storage medium having stored thereon processor-executable instructions configured to cause a processor of a computing device to perform the operations of the example methods.

Example 1. A method of error capturing implemented in a computing device, including: receiving a plurality of error data for a plurality of memories of a plurality of processors at an error logger, in which the plurality of memories of the plurality of processors includes a first memory of a first processor and the plurality of error data includes a first error data for the first memory of the first processor including an identification of at least one faulty bit of the first memory.

Example 2. The method of claim 1, further including receiving the plurality of error data for the plurality of memories of the plurality of processors at a plurality of error capture modules including receiving the first error data at an error capture module of the plurality of error capture modules.

Example 3. The method of claim 1, further including: receiving a plurality of requests from a plurality of error capture modules for the first processor at an error selection module for the first processor, in which each of the plurality of requests is configured to indicate to the error selection module at least one error data of the plurality of error data is stored at an error capture module of the plurality of error capture modules; and retrieving the first error data from a first error capture module of the plurality of error capture modules by the error selection module in response to a first request of the plurality of requests from the first error capture module having priority to a second request of the plurality of requests from a second error capture module of the plurality of error capture modules.

Example 4. The method of claim 3, further including: sending the first error data to the error logger; and storing the first error data at the error logger in an order relative to a stored error data of a memory of the plurality of memories of the plurality of processors, in which the plurality of error data includes the stored error data.

Example 5. The method of claim 3, further including: sending, from the error logger to the error selection module, a first acknowledgement signal configured to indicate receipt of the first error data; and retrieving a second error data from the second error capture module by the error selection module in response to the second request and the first acknowledgement signal.

Example 6. The method of claim 5, in which the second request has priority to a third request of the plurality of requests from a third error capture module of the plurality of error capture modules, the method further including: sending, from the error logger to the error selection module, a second acknowledgement signal configured to indicate receipt of the second error data; and retrieving a third error data from the third error capture module by the error selection module in response to a third request and the second acknowledgement signal.

Example 7. The method of claim 1, further including: receiving the first error data for the first memory of the first processor at the error logger, in which the first error data includes an identification of a number of faulty bits; generating a first interrupt signal configured as a single bit fault indicator in response to the identification of the number of faulty bits being one bit; and generating a second interrupt signal configured as a double bit fault indicator in response to the identification of the number of faulty bits being two bits.

Example 8. The method of claim 7, further including: receiving a third interrupt signal at a functional safety unit from the error logger; generating a first safety signal by the functional safety unit in response to the third interrupt signal being the first interrupt signal; and generating a second safety signal by the functional safety unit in response to the third interrupt signal being the second interrupt signal.

Example 9. The method of claim 1, in which the plurality of error data is configured with information identifying at least one faulty bit-cell location of the memory that is faulty.

Example 10. The method of claim 1, in which the error logger is a single error logger for the plurality of memories of the plurality of processors.

Computer program code or "program code" for execution on a programmable processor for carrying out operations of the various embodiments may be written in a high level programming language such as C, C++, C#, Smalltalk, Java, JavaScript, Visual Basic, a Structured Query Language (e.g., Transact-SQL), Perl, or in various other programming languages. Program code or programs stored on a computer readable storage medium as used in this application may refer to machine language code (such as object code) whose format is understandable by a processor.

The foregoing method descriptions and the process flow diagrams are provided merely as illustrative examples and are not intended to require or imply that the operations of the various embodiments must be performed in the order presented. As will be appreciated by one of skill in the art the order of operations in the foregoing embodiments may be performed in any order. Words such as "thereafter," "then," "next," etc. are not intended to limit the order of the operations; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm operations described in connection with the various embodiments may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the claims.

The hardware used to implement the various illustrative logics, logical blocks, modules, and circuits described in connection with the embodiments disclosed herein may be implemented or performed with a general purpose processor, a digital signal processor (DSP), an application-specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more embodiments, the functions described may be implemented in hardware, software, firmware, or any combination thereof. If implemented in software, the functions may be stored as one or more instructions or code on a non-transitory computer-readable medium or a non-transitory processor-readable medium. The operations of a method or algorithm disclosed herein may be embodied in a processor-executable software module that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the claims. Various modifications to these embodiments will be readily apparent to those skilled in the art, and the generic principles defined herein may be applied to other embodiments and implementations without departing from the scope of the claims. Thus, the present disclosure is not intended to be limited to the embodiments and implementations described herein, but is to be accorded the widest scope consistent with the following claims and the principles and novel features disclosed herein.

What is claimed is:

1. A method of error capturing implemented in a computing device, comprising:
   receiving a plurality of error data for a plurality of memories of a plurality of processors at an error logger, wherein the plurality of memories of the plurality of processors includes a first memory of a first processor and the plurality of error data includes a first error data for the first memory of the first processor including an identification of at least one faulty bit of the first memory.

2. The method of claim 1, further comprising receiving the plurality of error data for the plurality of memories of the plurality of processors at a plurality of error capture modules including receiving the first error data at an error capture module of the plurality of error capture modules.

3. The method of claim 1, further comprising:
   receiving a plurality of requests from a plurality of error capture modules for the first processor at an error selection module for the first processor, wherein each of the plurality of requests is configured to indicate to the error selection module at least one error data of the plurality of error data is stored at an error capture module of the plurality of error capture modules; and
   retrieving the first error data from a first error capture module of the plurality of error capture modules by the error selection module in response to a first request of the plurality of requests from the first error capture module having priority to a second request of the plurality of requests from a second error capture module of the plurality of error capture modules.

4. The method of claim 3, further comprising:
   sending the first error data to the error logger; and
   storing the first error data at the error logger in an order relative to a stored error data of a memory of the plurality of memories of the plurality of processors, wherein the plurality of error data includes the stored error data.

5. The method of claim 3, further comprising:
   sending, from the error logger to the error selection module, a first acknowledgement signal configured to indicate receipt of the first error data; and
   retrieving a second error data from the second error capture module by the error selection module in response to the second request and the first acknowledgement signal.

6. The method of claim 5, wherein the second request has priority to a third request of the plurality of requests from a third error capture module of the plurality of error capture modules,
   the method further comprising:
   sending, from the error logger to the error selection module, a second acknowledgement signal configured to indicate receipt of the second error data; and
   retrieving a third error data from the third error capture module by the error selection module in response to a third request and the second acknowledgement signal.

7. The method of claim 1, further comprising:
   receiving the first error data for the first memory of the first processor at the error logger, wherein the first error data includes an identification of a number of faulty bits;
   generating a first interrupt signal configured as a single bit fault indicator in response to the identification of the number of faulty bits being one bit; and
   generating a second interrupt signal configured as a double bit fault indicator in response to the identification of the number of faulty bits being two bits.

8. The method of claim 7, further comprising:
   receiving a third interrupt signal at a functional safety unit from the error logger;
   generating a first safety signal by the functional safety unit in response to the third interrupt signal being the first interrupt signal; and
   generating a second safety signal by the functional safety unit in response to the third interrupt signal being the second interrupt signal.

9. The method of claim 1, wherein the plurality of error data is configured with information identifying at least one faulty bit-cell location of the memory that is faulty.

10. The method of claim 1, wherein the error logger is a single error logger for the plurality of memories of the plurality of processors.

11. A computing device, comprising:
    a plurality of memories;
    a plurality of processors coupled to the plurality of memories; and
    an error logger coupled to the plurality of memories and configured to receive a plurality of error data for the plurality of memories of the plurality of processors at the error logger,
    wherein the plurality of memories of the plurality of processors includes a first memory of a first processor and the plurality of error data includes a first error data for the first memory of the first processor including an identification of at least one faulty bit of the first memory.

12. The computing device of claim 11, further comprising a plurality of error capture modules configured to receive the plurality of error data for the plurality of memories of the plurality of processors including receiving the first error data at an error capture module of the plurality of error capture modules.

13. The computing device of claim 12, further comprising an error selection module for the first processor, wherein the error selection module is configured to:
receive a plurality of requests from the plurality of error capture modules for the first processor, wherein each of the plurality of requests is configured to indicate to the error selection module at least one error data of the plurality of error data is stored at an error capture module of the plurality of error capture modules; and
retrieve the first error data from a first error capture module of the plurality of error capture modules in response to a first request of the plurality of requests from the first error capture module having priority to a second request of the plurality of requests from a second error capture module of the plurality of error capture modules.

14. The computing device of claim 13, wherein the error logger is further configured to:
store the first error data in an order relative to a stored error data of a memory of the plurality of memories of the plurality of processors, wherein the plurality of error data includes the stored error data.

15. The computing device of claim 13, wherein:
the error logger is further configured to send to the error selection module a first acknowledgement signal configured to indicate receipt of the first error data; and
the error selection module is further configured to retrieve a second error data from the second error capture module in response to the second request and the first acknowledgement signal.

16. The computing device of claim 15, wherein:
the second request has priority to a third request of the plurality of requests from a third error capture module of the plurality of error capture modules;
the error logger is further configured to send to the error selection module a second acknowledgement signal configured to indicate receipt of the second error data; and
the error selection module is further configured to retrieve a third error data from the third error capture module in response to a third request and the second acknowledgement signal.

17. The computing device of claim 11, the error logger is further configured to:
receive the first error data for the first memory of the first processor, wherein the first error data includes an identification of a number of faulty bits;
generate a first interrupt signal configured as a single bit fault indicator in response to the identification of the number of faulty bits being one bit; and
generate a second interrupt signal configured as a double bit fault indicator in response to the identification of the number of faulty bits being two bits.

18. The computing device of claim 17, further comprising a functional safety unit in communication with the error logger and configured to:
receive a third interrupt signal from the error logger;
generate a first safety signal unit in response to the third interrupt signal being the first interrupt signal; and
generate a second safety signal in response to the third interrupt signal being the second interrupt signal.

19. The computing device of claim 11, wherein the plurality of error data is configured with information identifying at least one faulty bit-cell location of the memory that is faulty.

20. The computing device of claim 11, wherein the error logger is a single error logger for the plurality of memories of the plurality of processors.

21. A computing device, comprising:
a plurality of memories;
a plurality of processors coupled to the plurality of memories;
an error logger coupled to the plurality of memories; and
means for receiving a plurality of error data for the plurality of memories of the plurality of processors at the error logger,
wherein the plurality of memories of the plurality of processors includes a first memory of a first processor and the plurality of error data includes a first error data for the first memory of the first processor including an identification of at least one faulty bit of the first memory.

22. The computing device of claim 21, further comprising:
a plurality of error capture modules; and
means for receiving the plurality of error data for the plurality of memories of the plurality of processors at the plurality of error capture modules including receiving the first error data at an error capture module of the plurality of error capture modules.

23. The computing device of claim 21, further comprising:
a plurality of error capture modules;
an error selection module for the first processor;
means for receiving a plurality of requests from the plurality of error capture modules for the first processor at the error selection module for the first processor, wherein each of the plurality of requests is configured to indicate to the error selection module at least one error data of the plurality of error data is stored at an error capture module of the plurality of error capture modules; and
means for retrieving the first error data from a first error capture module of the plurality of error capture modules by the error selection module in response to a first request of the plurality of requests from the first error capture module having priority to a second request of the plurality of requests from a second error capture module of the plurality of error capture modules.

24. The computing device of claim 23, further comprising:
means for sending the first error data to the error logger; and
means for storing the first error data at the error logger in an order relative to a stored error data of a memory of the plurality of memories of the plurality of processors, wherein the plurality of error data includes the stored error data.

25. The computing device of claim 23, further comprising:
means for sending, from the error logger to the error selection module, a first acknowledgement signal configured to indicate receipt of the first error data; and
means for retrieving a second error data from the second error capture module by the error selection module in response to the second request and the first acknowledgement signal.

26. The computing device of claim 25, wherein the second request has priority to a third request of the plurality of requests from a third error capture module of the plurality of error capture modules, the computing device further comprising:

means for sending, from the error logger to the error selection module, a second acknowledgement signal configured to indicate receipt of the second error data; and means for retrieving a third error data from the third error capture module by the error selection module in response to a third request and the second acknowledgement signal.

27. The computing device of claim 21, further comprising:

means for receiving the first error data for the first memory of the first processor at the error logger, wherein the first error data includes an identification of a number of faulty bits;

means for generating a first interrupt signal configured as a single bit fault indicator in response to the identification of the number of faulty bits being one bit; and means for generating a second interrupt signal configured as a double bit fault indicator in response to the identification of the number of faulty bits being two bits.

28. The computing device of claim 27, further comprising:

a functional safety unit;

means for receiving a third interrupt signal at the functional safety unit from the error logger;

means for generating a first safety signal by the functional safety unit in response to the third interrupt signal being the first interrupt signal; and means for generating a second safety signal by the functional safety unit in response to the third interrupt signal being the second interrupt signal.

29. The computing device of claim 21, wherein:

the plurality of error data is configured with information identifying at least one faulty bit-cell location of the memory that is faulty; and the error logger is a single error logger for the plurality of memories of the plurality of processors.

30. A non-transitory processor-readable medium having stored thereon processor executable instructions configured to cause a processor of a computing device to perform operations comprising:

receiving a plurality of error data for a plurality of memories of a plurality of processors at an error logger, wherein the plurality of memories of the plurality of processors includes a first memory of a first processor and the plurality of error data includes a first error data for the first memory of the first processor including an identification of at least one faulty bit of the first memory.

* * * * *